(12) United States Patent
Kawamori et al.

(10) Patent No.: US 8,278,024 B2
(45) Date of Patent: Oct. 2, 2012

(54) PHOTOSENSITIVE ADHESIVE COMPOSITION, AND OBTAINED USING THE SAME, ADHESIVE FILM, ADHESIVE SHEET, SEMICONDUCTOR WAFER WITH ADHESIVE LAYER, SEMICONDUCTOR DEVICE AND ELECTRONIC PART

(75) Inventors: Takashi Kawamori, Tsukuba (JP); Takashi Masuko, Tsukuba (JP); Shigeki Katogi, Tsukuba (JP); Masaaki Yasuda, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/859,720

(22) Filed: Aug. 19, 2010

(65) Prior Publication Data

US 2010/0314783 A1 Dec. 16, 2010

Related U.S. Application Data

(60) Division of application No. 11/969,358, filed on Jan. 4, 2008, now Pat. No. 7,851,131, which is a continuation of application No. PCT/JP2006/313114, filed on Jun. 30, 2006.

(30) Foreign Application Priority Data

Jul. 5, 2005 (JP) ................ P2005-196328
Nov. 17, 2005 (JP) ................ P2005-332955

(51) Int. Cl.
*G03F 7/00* (2006.01)
*G03F 7/004* (2006.01)

(52) U.S. Cl. ............... 430/270.1; 430/280.1; 430/281.1; 430/913

(58) Field of Classification Search ............... 430/270.1, 430/280.1, 281.1, 913
See application file for complete search history.

(56) References Cited

U.S. PATENT DOCUMENTS

| 6,355,703 | B1 | 3/2002 | Baba et al. | |
|---|---|---|---|---|
| 6,767,980 | B2 | 7/2004 | Yurugi et al. | |
| 6,887,580 | B2 | 5/2005 | Tokuhisa et al. | |
| 7,851,131 | B2* | 12/2010 | Kawamori et al. | 430/270.1 |
| 2011/0031631 | A1* | 2/2011 | Masuko et al. | 257/774 |
| 2011/0045639 | A1* | 2/2011 | Masuko et al. | 438/118 |
| 2011/0065043 | A1* | 3/2011 | Kawamori et al. | 430/270.1 |
| 2011/0065260 | A1* | 3/2011 | Kawamori et al. | 438/464 |
| 2011/0079927 | A1* | 4/2011 | Kawamori et al. | 257/783 |
| 2011/0121435 | A1* | 5/2011 | Mitsukura et al. | 257/632 |
| 2011/0151195 | A1* | 6/2011 | Mitsukura et al. | 428/156 |

(Continued)

FOREIGN PATENT DOCUMENTS

EP 0 957 126 11/1999

(Continued)

OTHER PUBLICATIONS

Korean Notice of Allowance issued Jun. 28, 2011, for KR Application No. 10-2009-7019401.

(Continued)

*Primary Examiner* — Amanda C. Walke
(74) *Attorney, Agent, or Firm* — Antonelli, Terry, Stout & Kraus, LLP.

(57) ABSTRACT

A photosensitive adhesive composition comprising: (A) a polyimide having a carboxyl group as a side chain, whereof the acid value is 80 to 180 mg/KOH; (B) a photo-polymerizable compound; and (C) a photopolymerization initiator.

20 Claims, 16 Drawing Sheets

U.S. PATENT DOCUMENTS

2011/0159238 A1* 6/2011 Kawamori et al. ........... 428/141

FOREIGN PATENT DOCUMENTS

| EP | 1 270 644 | 1/2003 |
|---|---|---|
| EP | 1270644 | 1/2003 |
| JP | 2-153934 | 6/1990 |
| JP | 04-337380 | 11/1992 |
| JP | 11-024257 | 1/1999 |
| JP | 11-043654 | 2/1999 |
| JP | 2000-136354 | 5/2000 |
| JP | 2000-290501 | 10/2000 |
| JP | 2001-257334 | 9/2001 |
| JP | 2001-329233 | 11/2001 |
| JP | 2002-167367 | 6/2002 |
| JP | 2003-149802 | 5/2003 |
| JP | 2003-345007 | 12/2003 |
| JP | 2005-055545 | 3/2005 |
| JP | 2005-056999 | 3/2005 |
| KR | 10-2008-0016927 | 2/2008 |
| TW | 574263 | 6/1991 |
| WO | WO 2004/111148 | 12/2004 |
| WO | WO 2005/019231 | 3/2005 |
| WO | WO 2007/004569 | 1/2007 |

OTHER PUBLICATIONS

English translation of the International Preliminary Report on Patentability dated Jan. 17, 2008, in International Application No. PCT/JP2006/313114, filed Jun. 30, 2006.

US Office Action dated Jan. 25, 2010, for U.S. Appl. No. 11/969,358.

Japanese Official Action dated Apr. 10, 2012, for JP Application No. 2009-168978.

Japanese Official Action dated May 29, 2012, for JP Application No. 2009-168980.

Taiwanese Official Action dated Jun. 8, 2012, for TW Application No. 97136307.

* cited by examiner

PHOTOSENSITIVE ADHESIVE COMPOSITION, AND OBTAINED USING THE SAME, ADHESIVE FILM, ADHESIVE SHEET, SEMICONDUCTOR WAFER WITH ADHESIVE LAYER, SEMICONDUCTOR DEVICE AND ELECTRONIC PART

RELATED APPLICATIONS

This is a Divisional application of application Ser. No. 11/969,358, filed Jan. 4, 2008 now U.S. Pat. No. 7,851,131, the contents of which are incorporated herein by reference in their entirety, which is a Continuation application of application serial no. PCT/JP2006/313114 filed on Jun. 30, 2006.

BACKGROUND OF THE INVENTION

1. Field of the Invention

This invention relates to a photosensitive adhesive composition, adhesive film obtained using the same, adhesive sheet, semiconductor wafer with adhesive layer, and semiconductor device and electronic components.

2. Related Background of the Invention

In recent years, due to the higher performance and higher functionality of electronic components, various types of semiconductor package have been proposed. In semiconductor packages, adhesives for bonding a semiconductor device to a supporting substrate for mounting the semiconductor device, and adhesives for bonding a semiconductor chip to various types of adherends, are required to have low stress, sticking property at low temperatures, wetproof reliability, and solder-proof reflow properties. In methods which simplify functions, forms and assembly processes for semiconductor packages or electronic parts, it may also be required to have a photosensitive function which allows formation of a pattern. Photosensitivity is a property whereby a part irradiated by light undergoes a chemical change, and becomes soluble or insoluble in an aqueous solution or an organic solvent. If an adhesive having such photosensitivity is used, by exposing it via a photomask and forming a pattern with a developer solution, it is possible to obtain a very fine adhesive pattern. Until now, photosensitive adhesives were based on a polyimide resin precursor (polyamide acid) or polyimide resin (JP-A No. 2000-290501, JP-A No. 2001-329233, JP-A No. 11-24257). However, in the former case, during a ring closure reaction to produce the imide, and in the latter case during the adhesion step, a high temperature of 300° C. or more was required, so thermal damage to surrounding material was severe. There was also the problem that residual heat stress was easily generated.

It has also been attempted to improve sticking property at low temperatures and solder heat resistance by blending and crosslinking a thermosetting resin with an adhesive using a polyimide resin or the like.

SUMMARY OF THE INVENTION

However, conventional photosensitive adhesives using a polyimide resin did not easily have both the ability to form a pattern with an alkali developer solution, and stick to an adherend at low temperature. Also, when bonded by thermocompression after light exposure, it was difficult to impart a re-adhesiveness which gave sufficiently high adhesive strength.

It is therefore an object of the present invention to provide a photosensitive adhesive composition having superior pattern-forming properties with an alkali developer solution, and sufficient re-adhesiveness after light exposure. The invention further aims to provide an adhesive film having superior pattern-forming properties with an alkali developer solution and sufficient re-adhesiveness after light exposure which can also be stuck to an adherend at low temperatures. It still further aims to provide highly reliable semiconductor devices and electronic components in which semiconductor chips are bonded with superior adhesive strength.

The photosensitive adhesive composition of the invention contains (A) a polyimide having a carboxyl group as a side chain, whereof the acid value is 80 to 180 mg/KOH, (B) a photo-polymerizable compound, and (C) a photopolymerization initiator. The aforesaid acid value is preferably 80 to 150 mg/KOH.

This photosensitive adhesive composition, by using a polyimide having a carboxyl group and an acid value within the aforesaid specific range, achieves both superior pattern-forming properties with an alkali developer solution and sufficient re-adhesiveness after exposure.

Alternatively, the photosensitive adhesive composition of the invention may contains (A) a polymer soluble to an alkaline aqueous solution, (B) a photo-polymerizable compound, and (C) a photopolymerization initiator. An adhesive pattern is formed by forming an adhesive layer consisted of the photosensitive adhesive composition on an adherend, light-exposing the adhesive layer via a photomask, and developing the adhesive layer with an alkaline aqueous solution after exposure. And another adherend can be bonded to the adherend via the adhesive pattern. The polymer soluble to alkaline aqueous solution is preferably a polyimide having a carboxyl group as a side chain.

The photosensitive adhesive composition of the invention preferably further contains (D) a thermosetting resin. This thermosetting resin is preferably an epoxy resin.

The aforesaid polyimide is preferably a polyimide obtained by reacting a tetracarboxylic acid dianhydride and diamine including an aromatic diamine expressed by the following general formula (I) or (II):

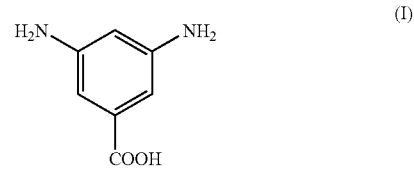

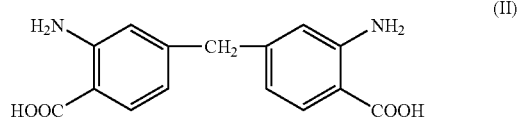

From the viewpoint of pattern-forming properties with an alkali developer solution and film-forming properties, the weight average molecular weight of the polyimide is preferably 5000 to 150000.

The glass transition temperature of the polyimide is preferably 150° C. or less. Due to this, the adhesive film comprising the photosensitive adhesive composition can be stuck to an adherend such as a semiconductor wafer at lower temperatures. For a similar reason, the aliphatic ether diamine expressed by the following general formula (III) preferably accounts for 10 to 90 mole % of the total diamine:

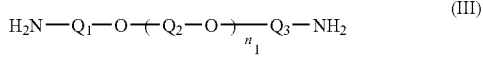

(III)

In the formula, $Q_1$, $Q_2$ and $Q_3$ are independently alkylene groups having 1 to 10 carbon atoms, and $n_1$ is an integer from 1 to 80.

In the aforesaid diamine, the siloxane diamine expressed by the following general formula (IV) preferably accounts for 1 to 20 mole % of the total diamine:

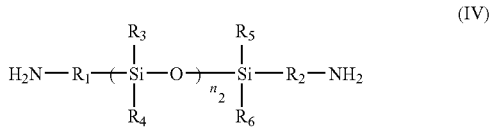

(IV)

In the formula, $R_1$ and $R_2$ are independently alkylene groups having 1 to 5 carbon atoms or phenylene groups which may have a substituent, $R_3$, $R_4$, $R_5$ and $R_6$ are independently an alkylene group having 1 to 5 carbon atoms, phenyl group or phenoxy group, and $n_2$ is an integer from 1 to 5.

The molecular weight of the photo-polymerizable compound is preferably 2000 or less. And the photosensitive adhesive composition of the invention preferably contains the photo-polymerizable compound to an extent of 20 weight parts or more relative to 100 weight parts of polyimide.

When a silicon chip is bonded to a glass substrate via the photosensitive adhesive composition of the invention, the photosensitive adhesive composition preferably provides a shear adhesive strength of 5 MPa or more at 25° C. Further, when a silicon chip is bonded to a glass substrate via the photosensitive adhesive composition of the invention, the photosensitive adhesive composition preferably provides a shear adhesive strength of 0.5 MPa or more at 260° C.

The storage modulus at 100° C. of the photosensitive adhesive composition after light exposure is preferably 0.01 to 10 MPa. After exposure, the storage modulus at 260° C. of the photosensitive resin composition after heat curing is preferably 1 MPa or more.

After light exposure, the temperature at which the mass reduction of the photosensitive adhesive composition is 5% in a thermogravimetric analysis after heat curing, is preferably 260° C. or more.

The adhesive film of the invention comprises the aforesaid photosensitive adhesive composition of the invention. The adhesive sheet of the invention comprises a substrate and the aforesaid adhesive film of the invention on one surface thereof.

The adhesive pattern of the invention is formed by forming an adhesive layer comprising the aforesaid photosensitive adhesive composition of the invention on an adherend, exposing this adhesive layer via a photomask, and developing the adhesive layer with an alkaline aqueous solution after exposure. Since the photosensitive adhesive composition of the invention has superior pattern-forming properties, this adhesive layer can have a very fine pattern, and has superior re-adhesiveness after light exposure.

The semiconductor wafer with an adhesive layer of the invention comprises a semiconductor wafer and an adhesive layer comprising the aforesaid photosensitive adhesive composition of the invention on one surface thereof.

The semiconductor device of the invention comprises a semiconductor chip bonded to an adherend using the aforesaid photosensitive adhesive composition of the invention. The electronic component of the invention comprises this semiconductor device.

The method of the invention for producing a semiconductor device comprises the steps of forming an adhesive pattern by forming an adhesive layer consisted of the photosensitive adhesive composition according to claim 1 on an adherend, light-exposing the adhesive layer via a photomask, and developing the adhesive layer with an alkaline aqueous solution after exposure, and bonding another adherend to the adherend via the adhesive pattern.

DESCRIPTION OF THE PREFERRED EMBODIMENTS

Figure 1:
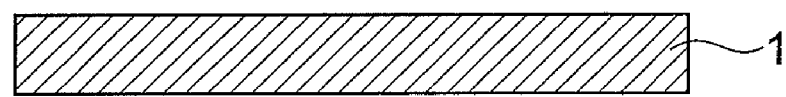
FIG. 1 is a cross-sectional view showing an embodiment of an adhesive film according to the invention.

Hereafter, the preferred embodiments of the invention will be described in detail, but the invention is not to be construed as being limited by the following embodiments.

The photosensitive adhesive composition according to this embodiment contains a polymer soluble to an alkaline aqueous solution, a photo-polymerizable compound and a photo-polymerization initiator.

The polymer is preferably soluble to tetramethyl ammonium hydride solution. For example. A polymer having a carboxyl group or hydroxy group tends to be soluble to alkaline aqueous solution. The polymer soluble to alkaline-aqueous solution may be a polyimide having a carboxyl group.

The aforesaid polyimide comprises one, two or more polymers having an imido skeleton in the main chain and a carboxyl group as a side chain. The acid value of the polyimide is 80 to 180 mg/KOH preferably. If the acid value of the polyimide is less than 80 mg/KOH, the solubility in an alkali developer solution tends to fall, but if it exceeds 180 mg/KOH, there is a relatively high possibility that the adhesive layer will separate from the adherend during developing. From this viewpoint, the acid value of the polyimide is more preferably 150 mg/KOH or less. The photosensitive adhesive composition preferably contains a thermosetting resin, described later, the acid value of the polyimide preferably being 80 to 180 mg/KOH.

The polyimide having a carboxyl group can be obtained by the reaction of a tetracarboxylic acid dianhydride and diamine having a carboxyl group and an amino group. The carboxyl group of the diamine is thereby introduced into the polyimide. By selecting the type of diamine, and suitably adjusting the ratio of diamine and reaction conditions, the acid value can be arranged to be 80 to 180 mg or 80 to 150 mg/KOH.

The reaction (condensation reaction) between the tetracarboxylic acid dianhydride and diamine can be performed by any known method as will be understood by a person skilled in the art. For example, in this reaction, an addition reaction is first carried out between tetracarboxylic acid dianhydride and diamine in equimolar or approximately equimolar proportions in an organic solvent at a reaction temperature of 80° C. or preferably 0 to 60° C. The addition order of each component is arbitrary. As the reaction proceeds, the viscosity of the reaction solution rises gradually, and a polyamide acid which is a precursor of the polyimide is produced. The molecular weight of this polyamide acid can also be adjusted by heating and depolymerizing at a temperature of 50 to 80° C. The polyimide is obtained by performing a dehydration ring closure of the polyamide acid. The dehydration ring closure can be performed by a thermal ring closure by the action of heat, or a chemical ring closure using a dehydrating agent.

Regarding the ratio of tetracarboxylic acid dianhydride to diamine, the total amount of diamine is preferably within the limits of 0.5 to 2.0 moles and more preferably 0.8 to 1.0 moles relative to a total amount of tetracarboxylic acid dianhydride of 1.0 mole. If the ratio of diamine exceeds 2.0 moles, numerous polyimide oligomers having a terminal amino group are produced, and if it is less than 0.5 moles, numerous polyimide oligomers having a terminal carboxyl group are produced. If the amount of these polyimide oligomers increases, the weight average molecular weight of polyimide decreases and various properties, such as the heat resistance of the photosensitive adhesive composition, are easily impaired. By adjusting the aforesaid ratio, the polyimide can be arranged to have a weight average molecular weight within the limits of 5000 to 150000.

To improve solubility in an alkaline aqueous solution, the diamine used to synthesize the polyimide includes preferably the aromatic diamine expressed by the aforesaid general formula (I) or (II).

To reduce Tg of the polyimide and reduce heat stress, it is still more preferred that the diamine includes the aliphatic ether diamine of the aforesaid general formula (III). Specific examples of the aliphatic ether diamine of formula (III) are the diamines expressed by the following chemical formulae (IIIa), (IIIb) or (IIIc). Among these, from the viewpoint of obtaining sticking properties at low temperatures and good adhesion to the adherend, the aliphatic ether diamine of formula (IIIa) is preferred.

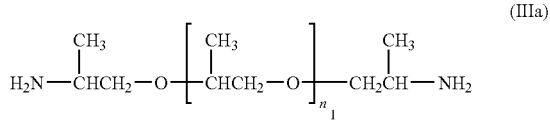

(IIIa)

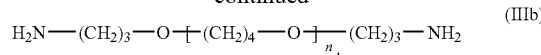

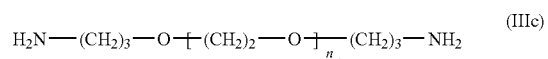

Commercial examples of an aliphatic ether diamine are Jeffamine "D-230", "D-400", "D-2000", "D-4000", "ED-600", "ED-900", "ED-2001", "EDR-148" (product names) from Sun Techno Chemical, and the polyether ether amines "D-230", "D-400", "D-2000" (product names) from BASF.

In order to further enhance re-adhesiveness after light exposure, it is preferable to use the siloxane diamine expressed by the aforesaid general formula (IV).

Examples of the siloxane diamine expressed by the chemical formula (IV), when $n_2$ in formula is 1, are 1,1,3,3-tetramethyl-1,3-bis(4-aminophenyl) disiloxane, 1,1,3,3-tetraphenoxy-1,3-bis(4-aminoethyl) disiloxane, 1,1,3,3-tetraphenyl-1,3-bis(2-aminoethyl)disiloxane, 1,1,3,3-tetraphenyl-1,3-bis(3-aminopropyl)disiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(3-aminobutyl)disiloxane, and 1,3-dimethyl-1,3-dimethoxy-1,3-bis(4-aminobutyl) disiloxane. Corresponding examples when $n_2$ is 2, are 1,1,3,3,5,5-hexa methyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)trisiloxane, 1,1,5,5-tetraphenyl-3,3-dimethoxy-1,5-bis(5-aminopentyl) trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane, and 1,1,3,3,5,5-hexapropyl-1,5-bis(3-aminopropyl)trisiloxane.

These diamines may be used alone, or two or more may be used together. In this case, it is preferred that the aromatic diamine expressed by the general formula (I) or (II) is 10 to 50 mole % of the total diamine, that the siloxane diamine expressed by the general formula (IV) is 1 to 20 mole % (still more preferably 5 to 10 mole %) of the total diamine, and that the aliphatic ether diamine expressed by the general formula (III) is 10 to 90 mole % of the total diamine. By this means, the acid value of the polyimide can usually be arranged to be 80 to 180 mg/KOH or 80 to 150 mg/KOH. If the siloxane diamine is less than 1 mole % of the total diamine, re-adhesiveness after light exposure tends to decrease, whereas if it exceeds 20 mole %, solubility in the alkali developer solution tends to decrease. If the aliphatic ether diamine is less than 10 mole % of the total diamine, Tg of the polyimide tends to increase and low temperature workability (sticking properties at low temperatures) tend to decrease, whereas if it exceeds 90 mole %, voids tend to be occur during thermocompression bonding.

The diamine may further contain a diamine other than those mentioned above, for example, o-phenylenediamine, m-phenylenediamine, p-phenylenediamine, 3,3'-diaminodiphenylether, 3,4'-diaminodiphenyl ether, 4,4'-diaminodiphenylether, 3,3'-diaminodiphenylmethane, 3,4'-diaminodiphenylmethane, 4,4'-diaminodiphenyl ether methane, bis (4-amino-3,5-dimethylphenyl)methane, bis(4-amino-3,5-diisopropylphenyl) methane, 3,3'-diaminodiphenyldifluoromethane, 3,4'-diaminodiphenyl difluoromethane, 4,4'-diaminodiphenyl difluoromethane, 3,3'-diaminodiphenylsulfone, 3,4'-diaminodiphenylsulfone, 4,4'-diaminodiphenylsulfone, 3,3'-diaminodiphenylsulfide, 3,4'-diaminodiphenylsulfide, 4,4'-diaminodiphenylsulfide, 3,3'-diaminodiphenylketone, 3,4'-diaminodiphenylketone, 4,4'-diaminodiphenylketone, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3'-(1,4-phenylenebis(1-methylethylidene))bis-aniline, 3,4'-(1,4-phenylenebis(1-methylethylidene))bis-aniline, 4,4'-(1,4-phenylenebis(1-methylethylidene))bis-aniline, 2,2-bis(4-(3-aminophenoxy)phenyl)propane, 2,2-bis(4-(3-aminophenoxy)phenyl)hexafluoropropane, 2,2-bis(4-(4-aminophenoxy)phenyl)hexafluoropropane, bis(4-(3-aminoethoxy)phenyl)sulfide, bis(4-(4-aminoethoxy)phenyl)sulfide, bis(4-(3-aminoethoxy)phenyl)sulfone, bis(4-(4-aminoethoxy)phenylsulfone, 1,3-bis(aminomethyl)cyclohexane, and 2,2-bis(4-aminophenoxyphenyl)propane.

The tetracarboxylic acid dianhydride used as starting material to synthesize the polyimide is preferably purified by recrystallization from acetic anhydride to suppress decrease in adhesive properties. Alternatively, tetracarboxylic acid dianhydride may be dried by heating at a temperature lower 10 to 20° C. than the melting point for 12 hours or more. The purity of tetracarboxylic acid dianhydride can be evaluated from the difference of endothermic starting temperature and endothermic peak temperature measured by a differential scanning calorimeter (DSC). It is preferable to use carboxylic acid dianhydride purified by recrystallization or drying so that this difference is less than 20° C., but more preferably less than 10° C., to synthesize the polyimide. The endothermic starting temperature and endothermic peak temperature are measured under the conditions of sample amount: 5 mg, heating rate: 5° C./min, measurement atmosphere: nitrogen, using a DSC (DSC-7, erkin Elmer Co.).

The tetracarboxylic acid dianhydride may be, for example, pyromellitic acid dianhydride, 3,3',4,4'-biphenyltetracarboxylic acid dianhydride, 2,2',3,3'-biphenyltetracarboxylic acid dianhydride, 2,2-bis(3,4-dicarboxyphenyl)propane dianhydride, 2,2-bis(2,3-dicarboxyphenyl)propane dianhydride, 1,1-bis(2,3-dicarboxy phenyl)ethane dianhydride, 1,1-bis(3,4-dicarboxyphenyl)ethane dianhydride, bis(2,3-dicarboxy phenyl)methane dianhydride, bis(3,4-dicarboxyphenyl)methane dianhydride, bis(3,4-dicarboxyphenyl)sulfone dianhydride, 3,4,9,10-perylene tetracarboxylic acid dianhydride, bis(3,4-dicarboxy phenyl) ether dianhydride, benzene-1,2,3,4-tetracarboxylic acid dianhydride, 3,4,3',4'-benzophenone tetracarboxylic acid dianhydride, 2,3,2',3'-benzophenone tetracarboxylic acid dianhydride, 3,3,3',4'-benzophenone tetracarboxylic acid dianhydride, 1,2,5,6-naphthalene tetracarboxylic acid dianhydride, 1,4,5,8-naphthalene tetracarboxylic acid dianhydride, 2,3,6,7-naphthalene tetracarboxylic acid dianhydride, 1,2,4,5-naphthalene tetracarboxylic acid dianhydride, 2,6-dichloronapthalene-1,4,5,8-tetracarboxylic acid dianhydride, 2,7-dichloronapthalene-1,4,5,8-tetracarboxylic acid dianhydride, 2,3,6,7-tetrachloronapthalene-1,4,5,8-tetracarboxylic acid dianhydride, phenanthrene-1,8,9,10-tetracarboxylic acid dianhydride, pyradine-2,3,5,6-tetracarboxylic acid dianhydride, thiophene 2,3,5,6-tetracarboxylic acid dianhydride, 2,3,3',4'-biphenyltetra carboxylic acid dianhydride, 3,4,3',4'-biphenyl tetracarboxylic acid dianhydride, 2,3,2',3'-biphenyl tetracarboxylic acid dianhydride, bis(3,4-dicarboxyphenyl) dimethylsilane dianhydride, bis(3,4-dicarboxyphenyl) methylphenylsilane dianhydride, bis(3,4-dicarboxyphenyl) diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylene bis(trimellitate anhydride), ethylene tetra carboxylic acid dianhydride, 1,2,3,4-butane tetracarboxylic acid dianhydride, decahydronaphthalene-1,4,5,8-tetracarboxylic acid dianhydride, 4,8-dimethyl-1,2,3,5,6,7-hexahydro naphthalene-1,2,5,6-tetracarboxylic acid dianhydride, cyclopentane-1,2,3,4-tetracarboxylic acid dianhydride, pyrrolidine-2,3,4,5-tetracarboxylic acid dianhydride, 1,2,3,4-cyclobutane tetracarboxylic acid dianhydride, bis(exo-bicyclo[2,2,1]heptane)-2,3-dicarboxylic acid dianhydride, bicyclo-[2,2,2]-octo-7-ene-2,3,5,6-tetracarboxylic acid dianhydride, 2,2-bis(3,4-dicarboxyphenyl)propane dianhydride, 2,2-bis[4-(3,4-dicarboxyphenyl)phenyl]propane dianhydride, 2,2-bis(3,4-dicarboxy phenyl)hexafluoropropane dianhydride, 2,2-bis[4-(3,4-dicarboxyphenyl) phenyl]hexafluoropropane dianhydride, 4,4'-bis(3,4-dicarboxyphenoxy) diphenylsulfide dianhydride, 1,4-bis(2-hydroxyhexafluoro isopropyl)benzene bis(trimellitic anhydride), 1,3-bis(2-hydroxy hexafluoroisopropyl)benzene bis(trimellitic anhydride), 5-(2,5-dioxotetrahydrofuril)-3-methyl-3-cyclohexene-1,2-dicarboxylic acid dianhydride, and tetrahydrofurane-2,3,4,5-tetracarboxylic acid dianhydride.

To impart solubility in solvents, the tetracarboxylic acid dianhydrides expressed by the following chemical formulae (V) or (VI) are preferred. In this case, the proportion of tetracarboxylic acid dianhydride expressed by these formulae is preferably 50 mole % or more relative to 100 mole % of total tetracarboxylic acid dianhydrides. If this proportion is less than 50 mole %, the solubility improvement effect tends to decrease.

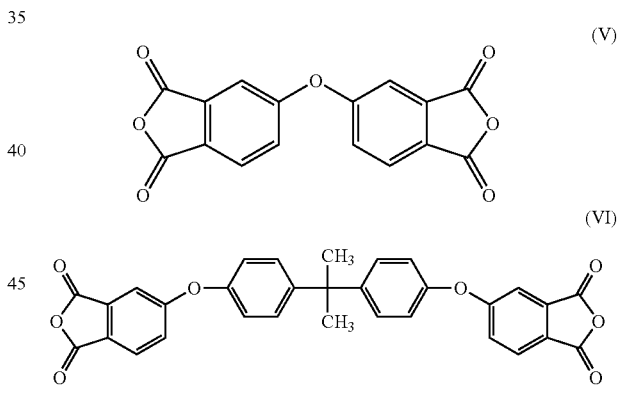

The aforesaid tetracarboxylic acid dianhydrides may be used alone, or two may be used together.

The weight average molecular weight of the polyimide is preferably within the limits of 5000 to 150000, more preferably 20000 to 50000, and still more preferably 30000 to 40000. If the weight average molecular weight of the polyimide is less than 5000, film-forming properties tend to decrease. If it exceeds 150000, solubility in an alkaline developer solution decreases and developing time tends to become long. By setting the weight average molecular weight of polyimide to 5000 to 150000, the heating temperature (die bonding temperature) when the semiconductor device is bonded to an adherend, such as a supporting substrate for semiconductor device mounting, can be arranged low. The aforesaid weight average molecular weight is a weight average molecular weight measured in terms of polystyrene using high performance liquid chromatography (e.g., "C-R4A" (product name), from Shimadzu Laboratories Inc.).

The glass transition temperature (hereafter, "Tg") of the polyimide preferably lies within the range of 30° C. to 150° C. If Tg is less than 30° C., there is a tendency for voids to occur during compression bonding. If Tg exceeds 150° C., the adherend sticking temperature and the compression bonding temperature after light exposure increase, and there is a tendency to damage surrounding parts. Tg is the peak temperature of tan δ when measuring a film using a viscoelasticity measuring apparatus (Rheometrix Co.).

The photo-polymerizable compound is not particularly limited provided that it is a compound which polymerizes by irradiation of radiation such as ultraviolet light or an electron beam. The photo-polymerizable compound is preferably a compound having an acrylate group or a methacrylate group. Examples of the photo-polymerizable compound are methyl acrylate, methyl methacrylate, ethyl acrylate, ethyl methacrylate, butyl acrylate, butyl methacrylate, 2-ethylhexyl acrylate, 2-ethylhexyl methacrylate, pentenylacrylate, tetrahydrofurfuryl acrylate, tetrahydrofurfuryl methacrylate, diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylol propane diacrylate, trimethylol propane triacrylate, trimethylol propane dimethacrylate, trimethylol propane trimethacrylate, 1,4-butanediol diacrylate, 1,6-hexane diol diacrylate, 1,4-butanediol dimethacrylate, 1,6-hexane diol dimethacrylate, pentaerythritol triacrylate, pentaerythritol tetraacrylate, pentaerythritol trimethacrylate, pentaerythritol tetramethacrylate, diheptaerythritol hexaacrylate, diheptaerythritol hexamethacrylate, styrene, divinylbenzene, 4-vinyltoluene, 4-vinylpyridine, N-vinyl pyrrolidone, 2-hydroxyethyl acrylate, 2-hydroxy ethyl methacrylate, 1,3-acryloyloxy-2-hydroxy propane, 1,2-methacryloyloxy-2-hydroxy propane, methylene bisacrylamide, N,N-dimethylacrylamide, N-methylol acrylamide, triacrylate of tris(beta-hydroxyethyl)isocyanurate, the compound expressed by the following general formula (10), urethane acrylate or urethane methacrylate, and urea acrylate. $R_3$ and $R_4$ in formula (10) represents independently a hydrogen atom or methyl group, and q and r represents independently an integer equal to 1 or more.

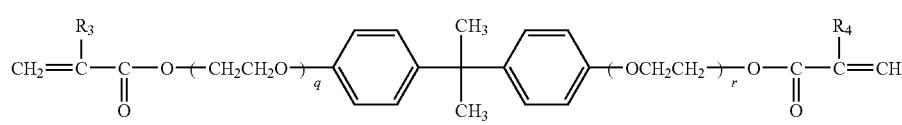

Urethane acrylate and urethane methacrylate are produced for example by reaction of a diol, the isocyanate compound expressed by the following general formula (21) and the compound expressed by the following general formula (22):

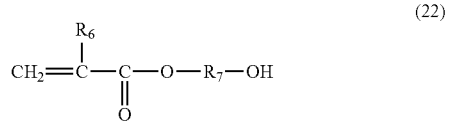

In formula (21), s is 0 or 1, and $R_5$ is a divalent or trivalent organic group having 1 to 30 carbon atoms. In formula (22), $R_6$ is a hydrogen atom or a methyl group, and $R_7$ is an ethylene or propylene group.

Urea methacrylate is produced by for example the reaction of the diamine expressed by the following general formula (31) and the compound expressed by the following general formula (32):

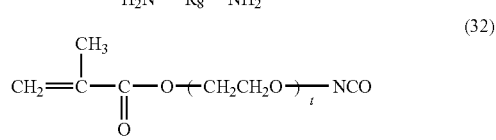

In formula (31), $R_8$ is a divalent organic group having 2 to 30 carbon atoms. In formula (32), t is 0 or 1.

In addition to the aforesaid compounds, photo-polymerizable copolymers having an ethylenic unsaturated group in a side chain, obtained by an addition reaction of a compound having at least one ethylenic unsaturated group and a functional group such as an oxirane ring, isocyanate group, hydroxyl group and carboxyl group with a vinyl copolymer having a functional group, may be used.

These photo-polymerizable compounds may be used alone, or two or more may be used together. Among these, the photo-polymerizable compounds expressed by the aforesaid general formula (10) are preferred from the viewpoint that they impart solvent resistance after curing, and urethane acrylate and urethane methacrylate are preferred from the viewpoint that they impart flexibility after curing.

The molecular weight of the photo-polymerizable compound is preferably 2000 or less. If the molecular weight exceeds 2000, solubility of the photosensitive adhesive composition in an alkaline aqueous solution decreases, tackiness of the adhesive film decreases, and it is difficult to stick the film to an adherend, such as a semiconductor wafer, at low temperature.

The content of the photo-polymerizable compound is preferably 20 to 80 weight parts, but more preferably 30 to 60 weight parts, relative to 100 weight parts of the polyimide. If the amount of photo-polymerizable compound exceeds 80 weight parts, the photo-polymerizable compound which has polymerized causes adhesive properties after thermocompression bonding to decrease. If it is less than 5 weight parts, solvent resistance after light exposure becomes low and it is difficult to form a pattern.

The photopolymerization initiator, to improve sensitivity when a pattern is formed, preferably has an absorption band at 300 to 400 nm. Examples of the photopolymerization initiator are aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethyl amino-1-(4-morpholinophenyl)-butanone-1,2,2-dimethoxy-1,2- diphenylethane-1-one, 1-hydroxy-cyclohexyl-phenyl-ketone, 2-methyl-1-(4-(methylthio)phenyl)-2-morpholinopropanone-1,2,4-diethylthioxanthone, 2-ethyl anthraquinone and phenanthrene quinone, benzoin ethers such as benzoin methyl ether, benzoin ethyl ether and benzoin phenyl ether, benzoins such as methyl benzoin and ethyl benzoin, benzyl derivatives such as benzyl dimethyl ketal, 2,4,5-triaryl imidazole dimers such as 2-(o-chlorophenyl)-4,5-diphenylimidazole dimer, 2-(o-chloro phenyl)-4,5-di(m-methoxyphenyl)imidazole dimer, 2-(o-fluoro phenyl)-4,5-phenylimidazole dimer, 2-(o-methoxyphenyl)-4,5-diphenyl imidazole dimer, 2-(p-methoxyphenyl)-4,5-diphenylimidazole dimer, 2,4-di(p-methoxyphenyl)-5-phenylimidazole dimer and 2-(2,4-dimethoxy phenyl)-4,5-diphenylimidazole dimer, acridine derivatives such as 9-phenylacridine and 1,7-bis(9,9'-acridinyl)heptane, and bis-acyl phosphine oxides such as bis(2,6-dimethoxybenzoyl)-2,4,4-trimethyl-pentyl phosphine oxide and bis(2,4,6,-trimethyl benzoyl)-phenyl phosphine oxide. These may be used alone, or two or more may be used together.

The amount of photopolymerization initiator is not particularly limited, but is usually 0.01 to 30 weight parts relative to 100 weight parts of polyimide.

The photosensitive adhesive composition preferably further contains a thermosetting resin. In the invention, thermosetting resin means a reactive compound which can crosslink due to the action of heat. Examples of such compounds are epoxy resin, cyanate resin, bismaleimide resin, phenol resin, urea resin, melamine resin, alkyd resin, acrylic resin, unsaturated polyester resin, diallyl phthalate resin, silicone resin, resorcinol formaldehyde resin, xylene resin, furan resin, polyurethane resin, ketone resin, triallyl cyanurate resin, polyisocyanate resin, resin containing tris(2-hydroxyethyl) isocyanurate, resin containing triallyl trimelitate, thermosetting resin synthesized from cyclopentadiene, and thermosetting resin obtained by trimerization of an aromatic dicyanamide. Among these, from the viewpoint of imparting superior adhesive force at high temperature, epoxy resin, cyanate resin and bismaleimide resin are preferred, and from the viewpoint of handling properties and compatibility with polyimide, epoxy resin is particularly preferred. These thermosetting resins may be used alone, or two or more may be used together.

The epoxy resin preferably has at least two epoxy groups in the molecule. From the viewpoint of curing properties or the properties of the cured material, glycidyl ether pf phenol type epoxy resins are particularly preferred. Examples of such epoxy resins are the glycidyl ether of bisphenol A, AD, S or F, glycidyl ether of hydrogenated bisphenol A, glycidyl ether of the ethylene oxide adduct of bisphenol A, glycidyl ether of the propylene oxide adduct of bisphenol A, glycidyl ether of phenol novolak resin, glycidyl ether of cresol novolak resin, glycidyl ether of bisphenol A novolak resin, glycidyl ether of naphthalene resin, glycidyl ethers with 3 functional groups or 4 functional groups, glycidyl ether of dicycloheptadiene phenol resin, glycidyl esters of dimeric acids, glycidyl amines with 3 functional groups or 4 functional groups, and the glycidyl amine of naphthalene resin. These may be used alone, or two or more may be used together.

Examples of cyanate resins are 2,2'-bis(4-cyanatephenyl) iso propylidene, 1,1'-bis(4-cyanatephenyl)ethane, bis(4-cyanate-3,5-dimethylphenyl)methane, 1,3-bis[4-cyanatephenyl-1-(1-methylethylidene)]benzene, cyanated phenol-di cyclopentane diene adduct, cyanated novolak, bis(4-cyanate phenyl) thioether, bis(4-cyanate phenyl)ether, resorcinol dicyanate, 1,1,1-tris(4-cyanate phenyl)ethane, and 2-phenyl-2-(4-cyanate phenyl)isopropylidene. These may be used alone, or two or more may be used together.

Examples of bismaleimide resins are o-, m- or p-bismaleimidebenzene, 4-bis(p-maleimidocumyl)benzene, 1,4-bis (m-maleimidocumyl)benzene and the maleimide compounds expressed by the following general formulae (40), (41), (42) or (43). These may be used alone, or two or more may be used together.

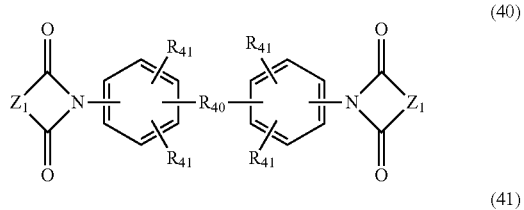

(40)

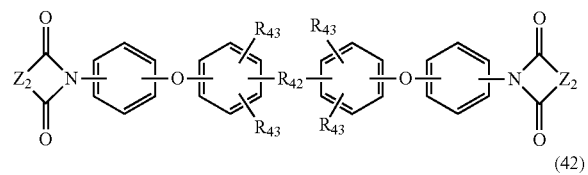

(41)

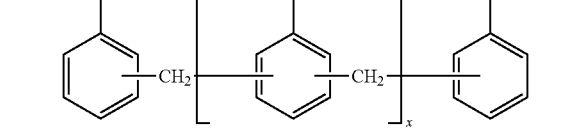

(42)

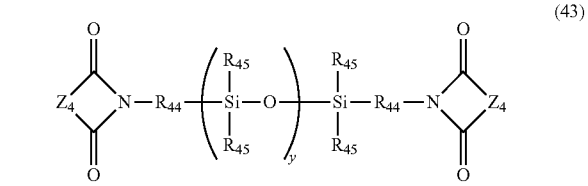

(43)

In formula (40), $R_{40}$ is —O—, —CH$_2$—, —CF$_2$—, —SO$_2$—, —S—, —CO—, —C(CH$_3$)$_2$— or —C(CF$_3$)$_2$—, the four $R_{41}$ are each a hydrogen atom, lower alkyl group or lower alkoxy group, fluorine, chlorine or bromine, and the two $Z_1$ are both dicarboxylic acid residues having an ethylenic unsaturated double bond.

In formula (41), $R_{42}$ is —O—, —CH$_2$—, —CF$_2$—, —SO$_2$—, —S—, —CO—, —C(CH$_3$)$_2$— or —C(CF$_3$)$_2$—, the four $R_{43}$ are each a hydrogen atom, lower alkyl group, lower alkoxy group, fluorine, chlorine or bromine, and the two $Z_2$ are both dicarboxylic acid residues having an ethylenic unsaturated double bond.

In formula (42), x is an integer from 0 to 4, and the plural $Z_3$ are each dicarboxylic acid residues having an ethylenic unsaturated double bond.

In formula (43), the two $R_{44}$ are both a divalent hydrocarbon group, the plural $R_{45}$ are each a monovalent hydrocarbon group, the two $Z_4$ are both dicarboxylic acid residues having an ethylenic unsaturated double bond, and y is an integer equal to 1 or more.

$Z_1, Z_2, Z_3$ and $Z_4$ in the formulae (40)-(43) may be a maleic acid residue or citraconic acid residue.

Examples of the bismaleimide resin expressed by formula (41) are 4,4-bismaleimidediphenyl ether, 4,4-bismaleimidediphenylmethane, 4,4-bismaleimide-3,3'-dimethyl-diphenylmethane, 4,4-bismaleimide diphenylsulfone, 4,4-bismaleimide diphenyl sulfide, 4,4-bismaleimide diphenylketone, 2'-bis(4-maleimidophenyl)propane, 4-bismaleimidediphenyl fluoromethane and 1,1,1,3,3,3-hexafluoro-2,2-bis(4-maleimidophenyl)propane.

Examples of the bismaleimide resin expressed by formula (42) are bis[4-(4-maleimidophenoxy)phenyl]ether, bis[4-(4-maleimidophenoxy) phenyl]methane, bis[4-(4-maleimidophenoxy)phenyl]fluoromethane, bis[4-(4-maleimidophenoxy)phenyl]sulfone, bis[4-(3-maleimidophenoxy) phenyl] sulfone, bis[4-(4-maleimidophenoxy)phenyl]sulfide, bis[4-(4-maleimido phenoxy)phenyl]ketone, 2-bis[4-(4-maleimidophenoxy) phenyl]propane and 1,1,1,3,3,3-hexafluoro-2,2-bis[4-(4-maleimidophenoxy)phenyl] propane.

When a thermosetting resin is used, in order to cure the resin, an additive such as a curing agent, curing promoter or catalyst may be suitably added to the photosensitive adhesive composition. When a catalyst is added, a co-catalyst can also be used if required.

If an epoxy resin is used, it is preferable to use an epoxy resin curing agent or curing agent promoter, and more preferable to use them together. The curing agent may be for example a phenolic compound, an aliphatic amine, an alicyclic amine, an aromatic polyamine, a polyamide, an aliphatic acid anhydride, an alicyclic acid anhydride, an aromatic acid anhydride, dicyandiamide, an organic acid dihydrazide, a boron trifluoride amine complex, imidazole or derivative thereof, a tertiary amine, or a phenolic compound having at least two phenolic hydroxyl groups in the molecule. Among these, from the viewpoint of superior solubility in an alkaline aqueous solution, a phenolic compound having at least two phenolic hydroxyl groups in the molecule is preferred.

Examples of the phenolic compound having at least two phenolic hydroxyl groups in the molecule are phenol novolak resin, cresol novolak resin, t-butyl phenol novolak resin, dicycloheptadiene cresol novolak resin, dicycloheptadiene phenol novolak resin, xylylene-modified phenol novolak resin, naphthol novolak resin, trisphenol novolak resin, tetrakis phenol novolak resin, bisphenol A novolak resin, poly-p-vinyl phenol resin and phenol aralkyl resin.

The curing promoter is not particularly limited provided that it promotes the curing of the epoxy resin, but examples are imidazoles, dicyandiamide derivatives, dicarboxylic acid dihydrazide, triphenyl phosphine, tetraphenylphosphoniumtetraphenyl borate, 2-ethyl-4-methyl imidazole-tetraphenyl borate, and 1,8-diazabicyclo[5.4.0]undecene-7-tetraphenyl borate.

The amount of epoxy resin curing agent is preferably 0 to 200 weight parts relative to 100 weight parts of epoxy resin, and the amount of curing agent promoter is preferably 0 to 50 weight parts relative to 100 weight parts of epoxy resin.

When a cyanate resin is used as the thermosetting resin, it is preferable to use a catalyst and a co-catalyst if required. The catalyst may be for example a metal salt or metal complex of cobalt, zinc or copper, and the co-catalyst is preferably a phenolic compound such as an alkylphenol, bisphenol compounds or phenol novolak.

When a bismaleimide resin is used as the thermosetting resin, it is preferably to use a radical polymerization agent as the curing agent. Examples of a radical polymerization agent are acetyl cyclohexyl sulfonylperoxide, isobutyryl peroxide, benzoyl peroxide, octanoyl peroxide, acetyl peroxide, dicumyl peroxide, cumene hydroperoxide, and azobisisobutyronitrile. The amount of radical polymerization agent used is preferably 0.01 to 1.0 weight parts relative to 100 weight parts of bismaleimide resin.

The photosensitive adhesive composition may contain a suitable coupling agent to increase adhesive strength. The coupling agent may be for example a silane coupling agent or titanium coupling agent, but among these, a silane coupling agent imparts a high adhesive strength and is therefore preferred.

If a coupling agent is used, its amount is preferably 0 to 50 weight parts and more preferably 0 to 20 weight parts relative to 100 weight parts of polyimide. If this exceeds 50 weight parts, there is a tendency for the storage stability of the photosensitive adhesive composition to decrease.

Examples of a silane coupling agent are vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxy silane, 3-aminopropyltrimethoxysilane, 3-glycidoxypropyltrimethoxy silane, 3-glycidoxypropylmethyldimethoxysilane, 2-(3,4-epoxy cyclohexyl) ethyltrimethoxysilane, 3-isocyanate propyltriethoxysilane, 3-methacryloxypropyltrimethoxysilane, 3-mercaptopropyltrimethoxy silane, 3-ureidopropyltriethoxysilane, N-(1,3-dimethylbutylidene)-3-(triethoxysilyl)-1-propane amine, N,N'-bis[3-(trimethoxysilyl)propyl]ethylenediamine, polyoxyethylene propyltrialkoxysilane and polyethoxydimethylsiloxane. These may be used alone, or two or more may be used together.

The photosensitive adhesive composition may contain a filler. The filler may be for example a metal filler such as silver powder, gold powder or copper powder, a non-metal filler such as silica, alumina, boron nitride, titania, glass, iron oxide, aluminum boride or ceramics, or an organic filler such as carbon or rubber filler.

The aforesaid fillers may be used according to their desired function. For example, a metal filler is added to impart conductivity or thixotropic properties to the adhesive film, a nonmetallic inorganic filler is added to impart low thermal expansion properties and low moisture absorption to the adhesive film, and an organic filler is added to impart toughness to the adhesive film. A metal filler, nonmetal inorganic filler and organic filler may be used alone, or two or more may be used together. If the fillers are blended together, kneading may be performed by a suitable combination of dispersing machines such as an ordinary agitator, kneader, three-roll mill and ball mill.

If a filler is used, its amount is preferably 1000 weight parts or less, and more preferably 500 weight parts or less, relative to 100 weight parts of polyimide. The lower limit is not particularly limited, but it is usually 1 weight part. If the filler amount exceeds 1000 weight parts, there is a tendency for adhesiveness to decrease.

When a silicon chip is bonded to a glass substrate via this photosensitive adhesive composition, it should preferably provide a shear adhesive strength at 25° C. of 5 MPa or more. If the shear adhesive strength at 25° C. is less than 5 MPa, it is difficult to obtain an adhesive bond which can withstand the external forces applied when assembling electronic parts. Further, when a silicon chip is bonded to a glass substrate via this photosensitive adhesive composition, the photosensitive adhesive composition should preferably provide a shear adhesive strength at 260° C. of 0.5 MPa or more. If the shear adhesive strength at 260° C. is less than 0.5 MPa, it is difficult to suppress debonding or destruction during high temperature heating when the semiconductor device obtained by using the photosensitive adhesive composition is mounted on the substrate by soldering.

The shear adhesive strength at 25° C. or 260° C. is the shear adhesive strength (maximum stress) measured by using a laminate comprising a silicon chip of 3 mm×3 mm×400 μm thickness and a glass substrate of 10 mm×10 mm×0.55 mm thickness bonded together via an adhesive layer of the photosensitive adhesive composition of thickness approx. 40 μm which has been exposed and heated as a test peace, the shear adhesive strength is measured when an external force in the shear direction is applied to a lateral wall of the silicon chip under the conditions of measurement temperature: 25° C. or 260° C., measurement rate: 50 μm/sec and measurement height: 50 μm. The measuring device is an adhesive strength tester "Dage-4000" from Dage Co.

The aforesaid laminate is typically prepared by the following procedure. First, an adhesive film of the photosensitive adhesive composition is formed on a polyethylene terephthalate film (PET film), and this adhesive film is laminated on a silicon wafer of size 6 inches, thickness 400 μm. The lamination is performed under the conditions of line pressure: 4 kgf/cm, feed rate: 0.5 m/min while heating to 80° C. using a device having a roll and a support. Next, the laminated adhesive film is irradiated from the PET film side by ultraviolet light of 1000 mJ/cm$^2$. Then, the silicon wafer is cut together with the adhesive film, and a silicon chip with an adhesive film of size 3 mm×3 mm is thus obtained. After the PET film is peeled off and a pressure-sensitive dicing tape is laminated on the adhesive film, the silicon wafer is cut using a dicer. The silicon chip with adhesive film is then mounted on a glass substrate of thickness 10 mm×10 mm×0.55 mm such that the adhesive film is in contact with the glass substrate, and it is thermocompression bonded on a 120° C. heating plate under the conditions of 500 gf for 10 seconds. The adhesive film is further cured by heating in a 160° C. oven for 3 hours. By the above procedure, the aforesaid laminate for measuring shear adhesive strength is obtained.

The storage modulus of the photosensitive adhesive composition at 100° C. after light exposure is preferably 0.01 to 10 MPa. If the storage modulus is less than 0.01 MPa, resistance to the heat and pressure applied during thermocompression bonding after pattern-forming decreases and the pattern is easily crushed, whereas, if it exceeds 10 MPa, re-adhesiveness after exposure decreases, and the temperature required to obtain sufficient adhesive strength during thermocompression bonding to the adherend after pattern-forming becomes higher.

The value of the storage modulus is obtained by measuring the dynamic viscoelasticity of a test piece of the photosensitive resin composition exposed to light. The dynamic viscoelasticity is measured under the conditions of heating rate: 5° C., frequency: 1 Hz, measurement temperature: 50° C. to 200° C. The measuring device is, for example, a "RSA-2" viscoelasticity analyzer, Rheometrix Co.

The test piece for dynamic viscoelasticity measurement is typically prepared as follows. First, an adhesive sheet having a PET film and an adhesive film of thickness approx. 40 μm formed on one surface thereof, is cut to a size of 35 mm×10 mm, and it is irradiated by ultraviolet light from the PET film side under the condition of light exposure: 1000 mJ/cm$^2$ using a high precision parallel exposure device (ORC Manufacturing Co.). After exposure, the PET film is peeled off and the aforesaid test piece is thus obtained.

The storage modulus of the photosensitive adhesive composition at 260° C. after light exposure and heat curing is preferably 1 MPa or more. If this storage modulus is less than 1 MPa, when the semiconductor device obtained using the photosensitive adhesive composition is mounted on a substrate by soldering, it is difficult to suppress debonding or destruction during high temperature heating.

The value of the storage modulus is obtained by measuring the dynamic viscoelasticity of a test piece comprising the photosensitive resin composition after light exposure and heat curing. The dynamic viscoelasticity is measured under the conditions of heating rate: 5° C., frequency: 1 Hz, measurement temperature:-50° C. to 300° C. The measuring device is, for example, a "RSA-2" viscoelasticity analyzer, Rheometrix Co.

The adhesive film for the aforesaid dynamic viscoelasticity measurement is typically obtained by heat curing in a 160° C. oven for 3 hours after exposed under identical conditions to those mentioned above for the preparation of a test piece for dynamic viscoelasticity measurement after light exposure.

The temperature at which the mass percentage reduction of the photosensitive adhesive composition in a thermogravimetric analysis after light exposure and heat curing is 5% (hereafter "5% mass decrease temperature"), is preferably 260° C. or more. If the 5% mass decrease temperature is less than 260° C., it tends to be difficult to suppress debonding or destruction during high temperature heating when the semiconductor device obtained using the photosensitive adhesive composition is mounted on a substrate by soldering. Further, the possibility of soiling surrounding material or parts due to volatile constituents generated during the heating, becomes high.

The 5% mass decrease temperature is the temperature at which the mass percentage reduction relative to the initial mass is 5% in a thermogravimetric analysis performed under the conditions of heating rate: 10° C./min, air flow rate: 80 mL/min, measurement temperature: 40° C. to 400° C. The sample for thermogravimetric analysis is prepared by finely crushing an adhesive film, light-exposed and heated under identical conditions to those described for the storage modulus after heat curing was performed following light exposure, using a mortar. The measuring device is, for example, a Simultaneous Thermogravimetric Differential Thermal Analyzer "EXSTAR 6300", S.I.I. Nanotechnology Co.

The above properties can be obtained by preparing the photosensitive adhesive composition using the polyimide, photo-polymerizable compound and photopolymerization initiator, and the thermosetting resin and filler if required, and adjusting the types and blending ratio thereof.

Figure 2:
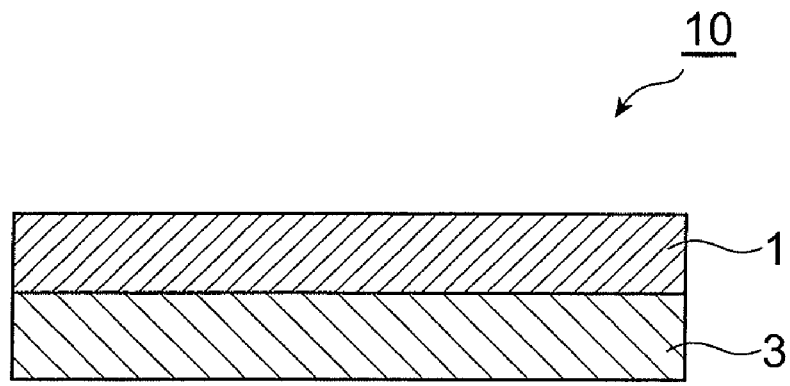
FIG. 2 is a cross-sectional view showing an embodiment of an adhesive sheet according to the invention.

FIG. 1 is a cross-sectional view showing an embodiment of the adhesive film according to the invention. Adhesive film 1 shown in FIG. 1 is obtained by forming the aforesaid photosensitive adhesive composition in the shape of a film. FIG. 2 is a cross-sectional view showing an embodiment of the adhesive sheet according to the invention. Adhesive sheet 10 shown in FIG. 2 comprises a substrate 3, and an adhesive layer consisted of the adhesive film 1 provided on one surface thereof.

The adhesive film 1 can be obtained by for example blending the polyimide, photo-polymerizable compound, photopolymerization initiator and other components if required in an organic solvent, kneading the mixture to prepare a varnish, and after forming a layer of this varnish on the substrate 3, drying the varnish layer by heating and then removing the substrate 3. It can also be stored and used as the adhesive sheet 10 without removing the substrate 3.

The aforesaid blending and kneading may be performed by suitably combining dispersion machines such as an ordinary agitator, kneader, three-roll mill and ball mill. If a thermosetting resin is used, drying is performed at a temperature at which the thermosetting resin does not fully react during drying and at which the solvent vaporizes to a sufficient extent. Specifically the varnish layer is dried by heating usually at 60 to 180° C. for 0.1 to 90 minutes.

The temperature at which the thermosetting resin does not fully react is a temperature below the peak temperature of the heat of reaction when measured under the conditions of sample amount 10 mg, heating rate 5° C./min, measuring atmosphere: air, using a DSC (e.g., "DSC-7" (product name), Perkin Elmer Co.).

The organic solvent, i.e., the varnish solvent, used for preparation of the varnish is not particularly limited provided that the materials can be dissolved or distributed homogeneously. Examples are dimethylformamide, toluene, benzene, xylene, methyl ethyl ketone, tetrahydrofuran, ethyl cellosolve, ethyl cellosolve acetate, dioxane, cyclohexanone, ethyl acetate and N-methyl-pyrrolidinone.

The thickness of the varnish layer is preferably 1 to 100 μm. If this thickness is less than 1 μm, there is a tendency for adherend fixing ability to decrease, and if it exceeds 100 μm, residual volatile material in the obtained adhesive film 1 tends to increase.

The residual volatile material in the adhesive film 1 is preferably 10 mass % or less. If this residual volatile material exceeds 10 mass %, voids easily remain in the adhesive layer due to foaming by volatilization of solvent from heating during assembly, and wetproof reliability easily decreases. There is also an increased possibility of contaminating surrounding material or parts due to volatile constituents generated during heating. This residual volatile constituent is calculated by the equation:

the residual volatile material $(M\%) = \{(M2-M1)/M1\} \times 100$, wherein the initial mass of an adhesive film cut to a size of 50 mm×50 mm is M1, and the mass after heating this adhesive film in a 160° C. oven for 3 hours is M2.

The substrate 3 is not particularly limited provided that it can withstand the aforesaid drying conditions. For example, a polyester film, polypropylene film, polyethylene terephthalate film, polyimide film, polyether imide film, polyether naphthalate film and methyl pentene film can be used as the substrate 3. The film used as the substrate 3 may be a multilayer film which combines two or more types, and the surface thereof may be treated with a silicone type or silica type release agent.

Figure 3:
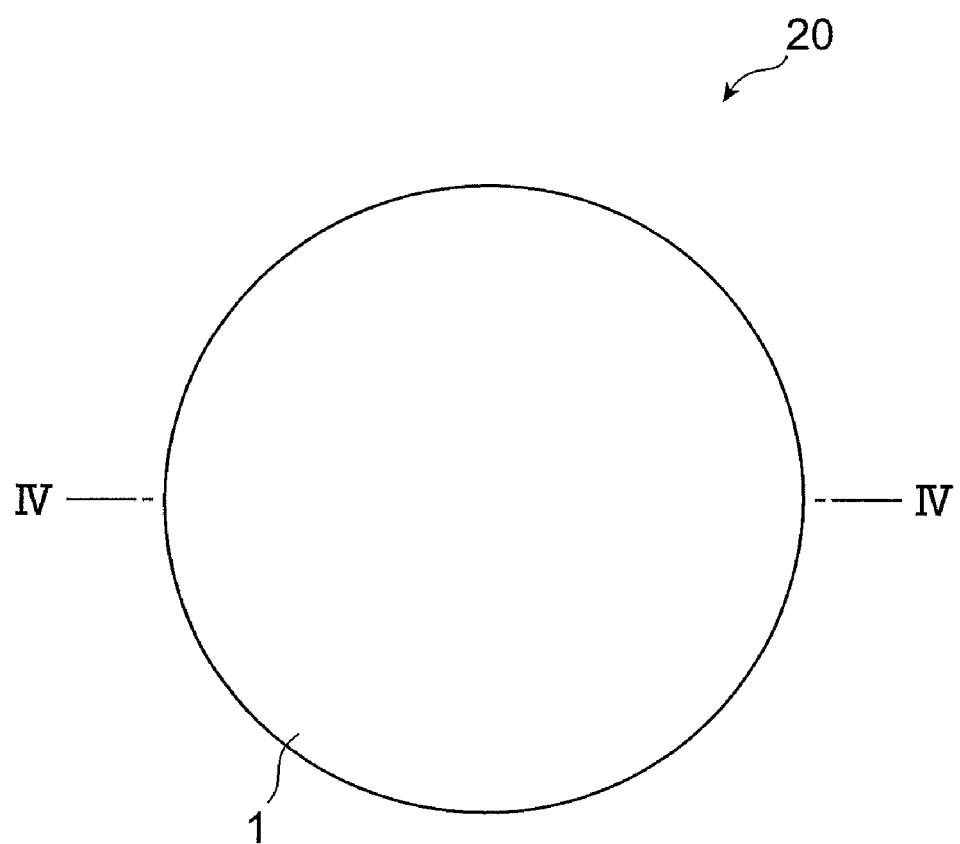
FIG. 3 is a top view showing an embodiment of a semiconductor wafer with an adhesive layer according to the invention.
Figure 4:
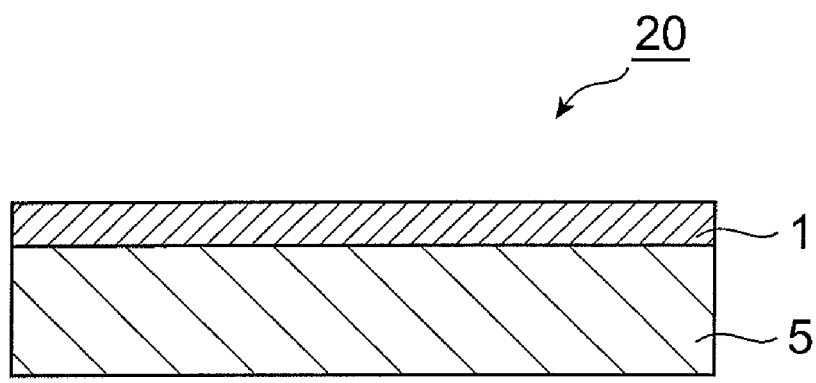
FIG. 4 is an end elevation along a line IV-IV in FIG. 3.

FIG. 3 is a top view showing an embodiment of a semiconductor wafer with adhesive layer according to the invention. FIG. 4 is an end elevation along a line IV-IV of FIG. 3. A semiconductor wafer 20 with adhesive layer shown in FIGS. 3, 4 comprises a semiconductor wafer 5 and an adhesive layer 1 consisted of the aforesaid photosensitive adhesive composition provided on one surface thereof. The semiconductor wafer 5 is typically a silicone wafer.

The semiconductor wafer 20 with adhesive layer is obtained by laminating the adhesive film 1 on the semiconductor wafer 5 while heating. Since the adhesive film 1 is a film comprising the aforesaid photosensitive adhesive composition, it can be stuck to the semiconductor wafer 20 at low temperatures, for example, room temperature to approx. 100° C.

The semiconductor wafer 20 with adhesive layer may be used to manufacture electronic components such as a CCD camera module or CMOS camera module via a step wherein an adherend is bonded to the semiconductor wafer 5 via the adhesive layer 1. Hereafter, a case of manufacturing a CCD camera module will be described. A CMOS camera module can be manufactured by an identical method.

Figure 5:
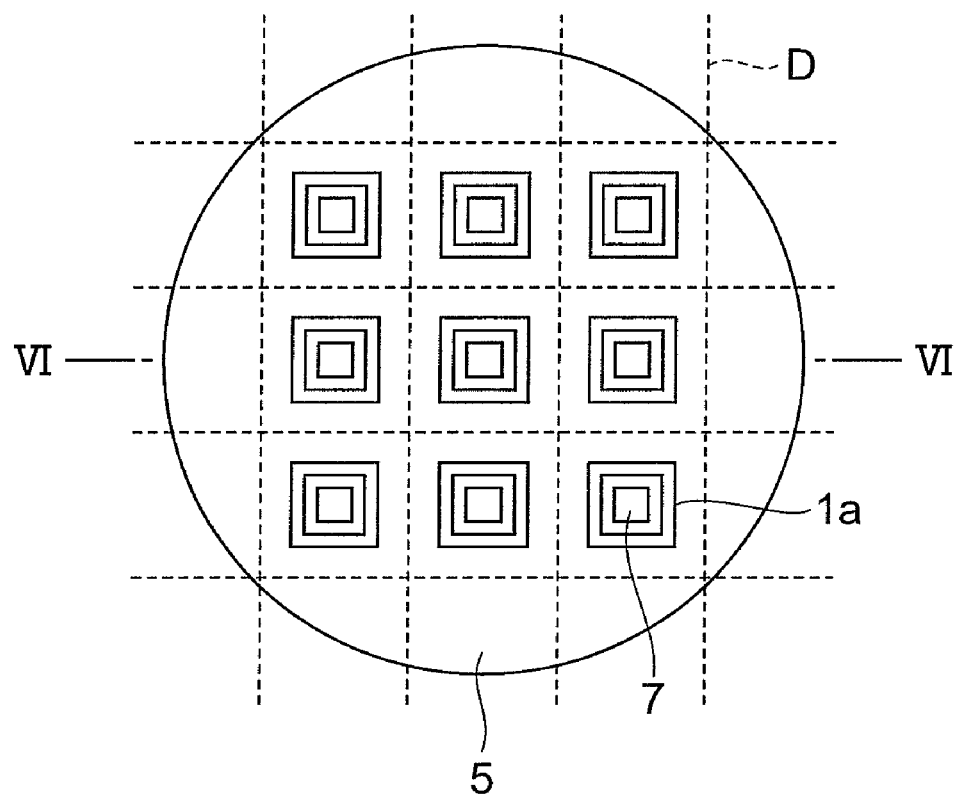
FIG. 5 is a top view showing an embodiment of an adhesive pattern according to the invention.
Figure 6:
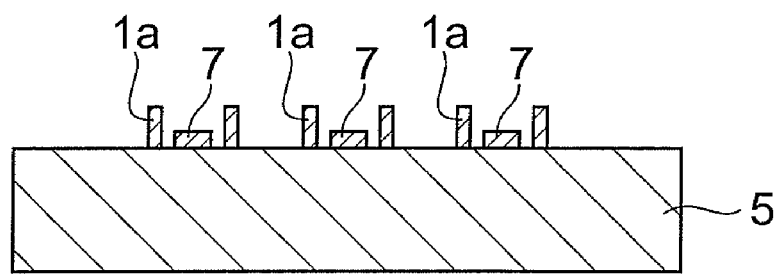
FIG. 6 is an end elevation along a line VI-VI in FIG. 5.

FIG. 5 is a top view showing an embodiment of an adhesive pattern according to the invention. FIG. 6 is an end elevation along a line VI-VI of FIG. 5. On the semiconductor wafer 5 which is the adherend, an adhesive pattern 1a shown in FIGS. 5, 6 is formed along the sides of an approximate square surrounding plural effective pixel regions 7 on the semiconductor wafer 5.

Figure 7:
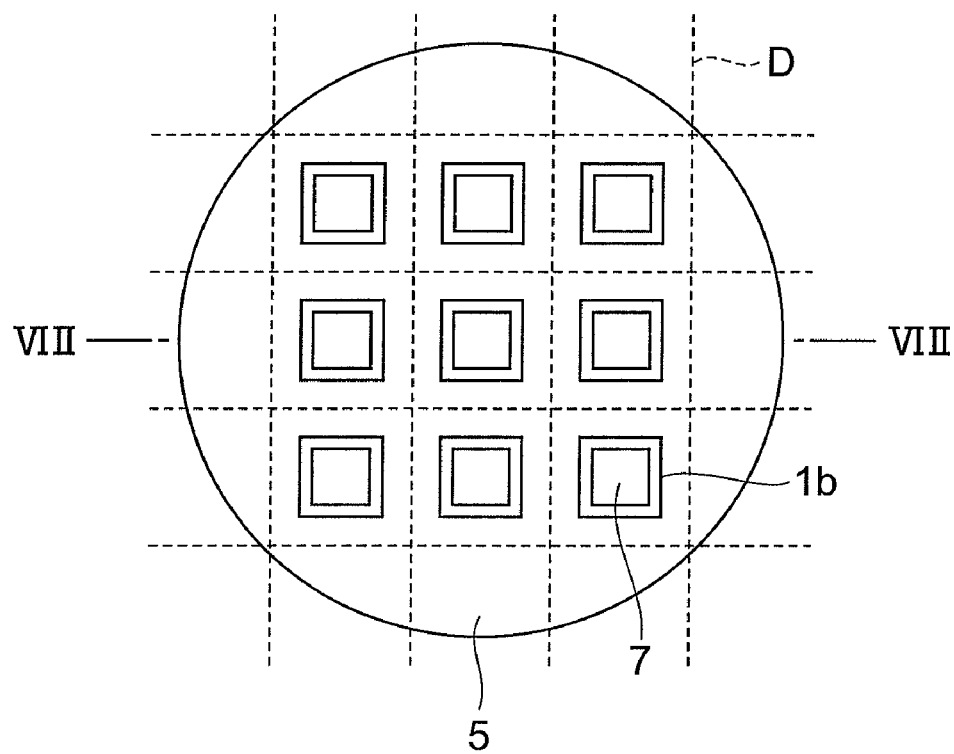
FIG. 7 is a top view showing an embodiment of an adhesive pattern according to the invention.
Figure 8:
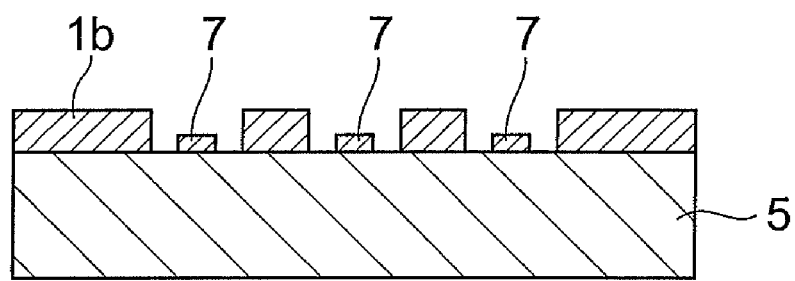
FIG. 8 is an end elevation along a line VIII-VIII in FIG. 7.

FIG. 7 is a top view showing an embodiment of an adhesive pattern according to the invention. FIG. 8 is an end elevation along a line VIII-VIII of FIG. 8. In the semiconductor wafer 5 which is the adherend, an adhesive pattern 1b shown in FIGS. 7, 8 is patterned so that an approximately square opening in which the effective pixel regions 7 are exposed on the semiconductor wafer 5 is formed.

The adhesive patterns 1a, 1b are formed by forming the adhesive layer consisted of the photosensitive adhesive composition on the semiconductor wafer 5 as adherend to obtain the semiconductor wafer with adhesive layer 20, light-exposing the adhesive layer 1 via a photomask, and after exposure, developing the adhesive layer 1 with an alkaline aqueous solution. Therefore, the adhesive patterns 1a, 1b comprise the photosensitive adhesive composition after light exposure.

Figure 9:
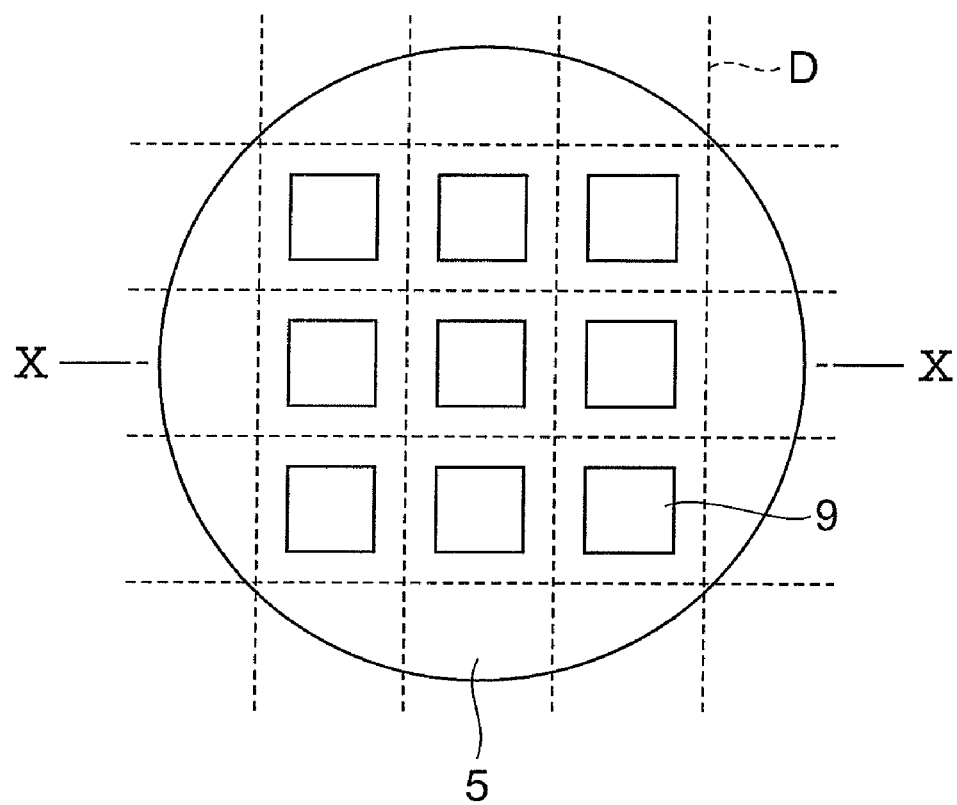
FIG. 9 is a top view showing a state where a cover glass is bonded to a semiconductor wafer via an adhesive pattern.
Figure 10:
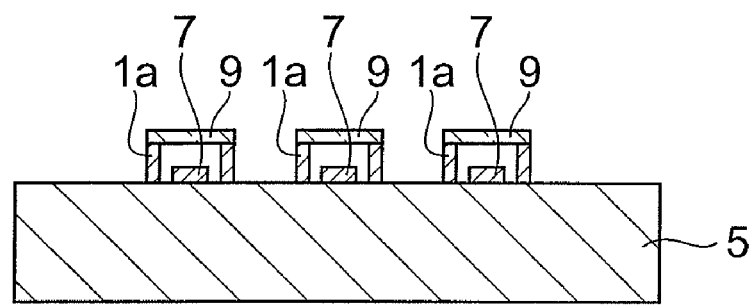
FIG. 10 is an end elevation along a line X-X in FIG. 9.
Figure 11:
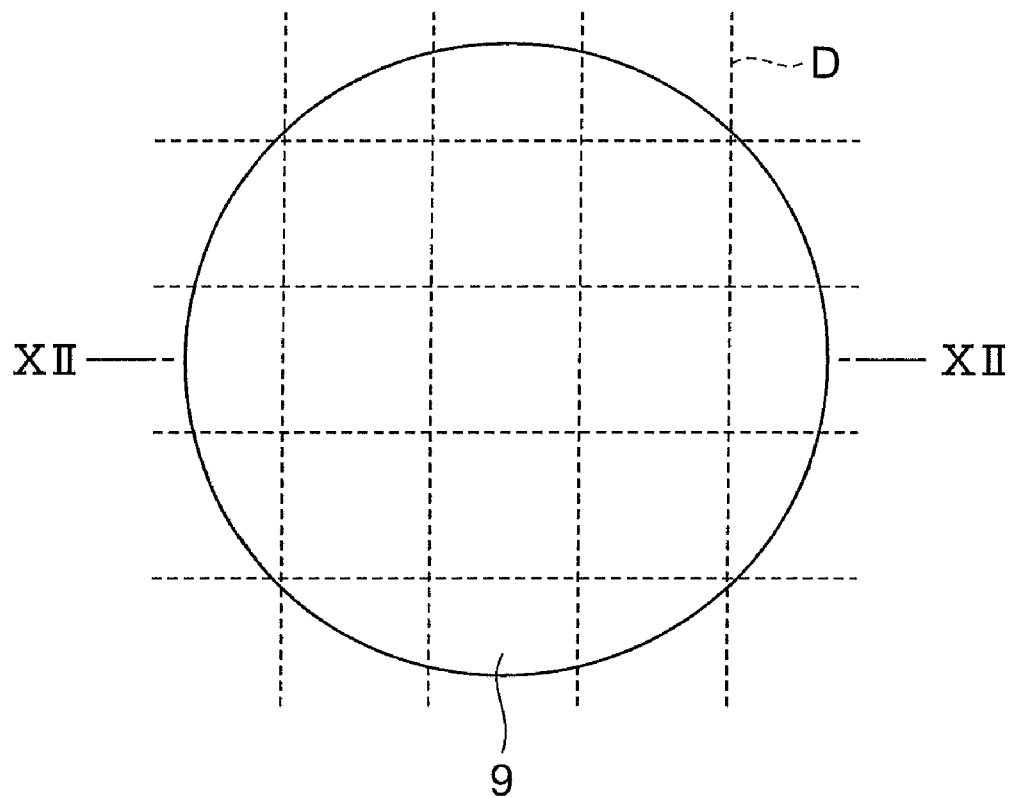
FIG. 11 is a top view showing a state where a cover glass is bonded to a semiconductor wafer via an adhesive pattern.
Figure 12:
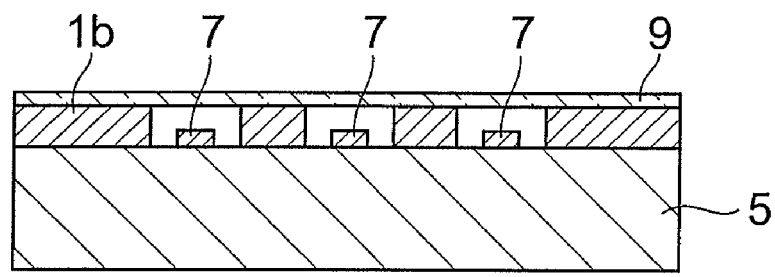
FIG. 12 is an end elevation along a line XII-XI in FIG. 11.

Next, a cover glass 9 as another adherend is bonded to the semiconductor wafer 5 via the adhesive pattern 1a or 1b. FIG. 9 is a top view showing a state where the cover glass 9 is bonded to the semiconductor wafer 5 via the adhesive pattern 1a. FIG. 10 is an end elevation along a line X-X of FIG. 9. FIG. 11 is a top view showing a state where the cover glass 9 is bonded to the semiconductor wafer 5 via the adhesive pattern 1b. FIG. 12 is an end elevation along a line XI-XI of FIG. 11. The cover glass 9 is bonded to the semiconductor wafer 5 with the heat-cured adhesive pattern 1a or 1b sandwiched therebetween. The cover glass 9 is mounted on the adhesive pattern 1a or 1b, and the cover glass 9 is bonded by thermocompression. The adhesive pattern 1a or 1b functions as an adhesive for adhering the cover glass 9, and also function as a spacer for ensuring there is sufficient space surrounding the effective pixel regions 7.

Figure 13:
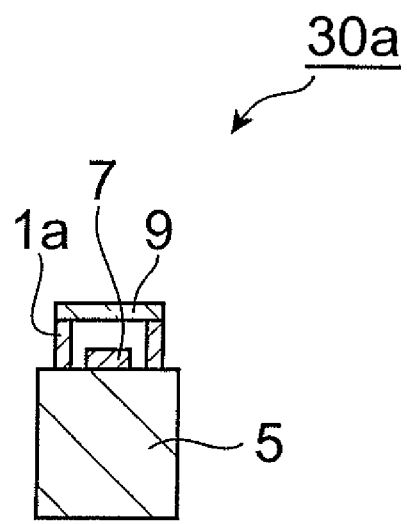
FIG. 13 is an end elevation showing an embodiment of a semiconductor device according to the invention.
Figure 14:
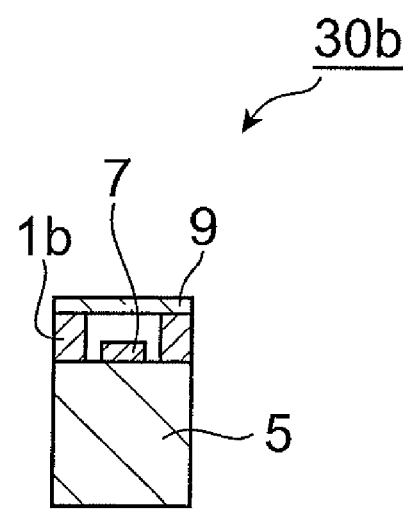
FIG. 14 is an end elevation showing an embodiment of a semiconductor device according to the invention.

After adhering the cover glass 9, a semiconductor device 30a shown in FIG. 13 or a semiconductor device 30b shown in FIG. 14 is obtained by dicing along the broken line D. The semiconductor device 30a comprises the semiconductor chip 5, effective pixel regions 7, adhesive pattern (adhesive layer) 1a and cover glass 9. The semiconductor device 30b comprises the semiconductor chip 5, effective pixel regions 7, adhesive pattern (adhesive layer) 1b and cover glass 9.

Figure 15:
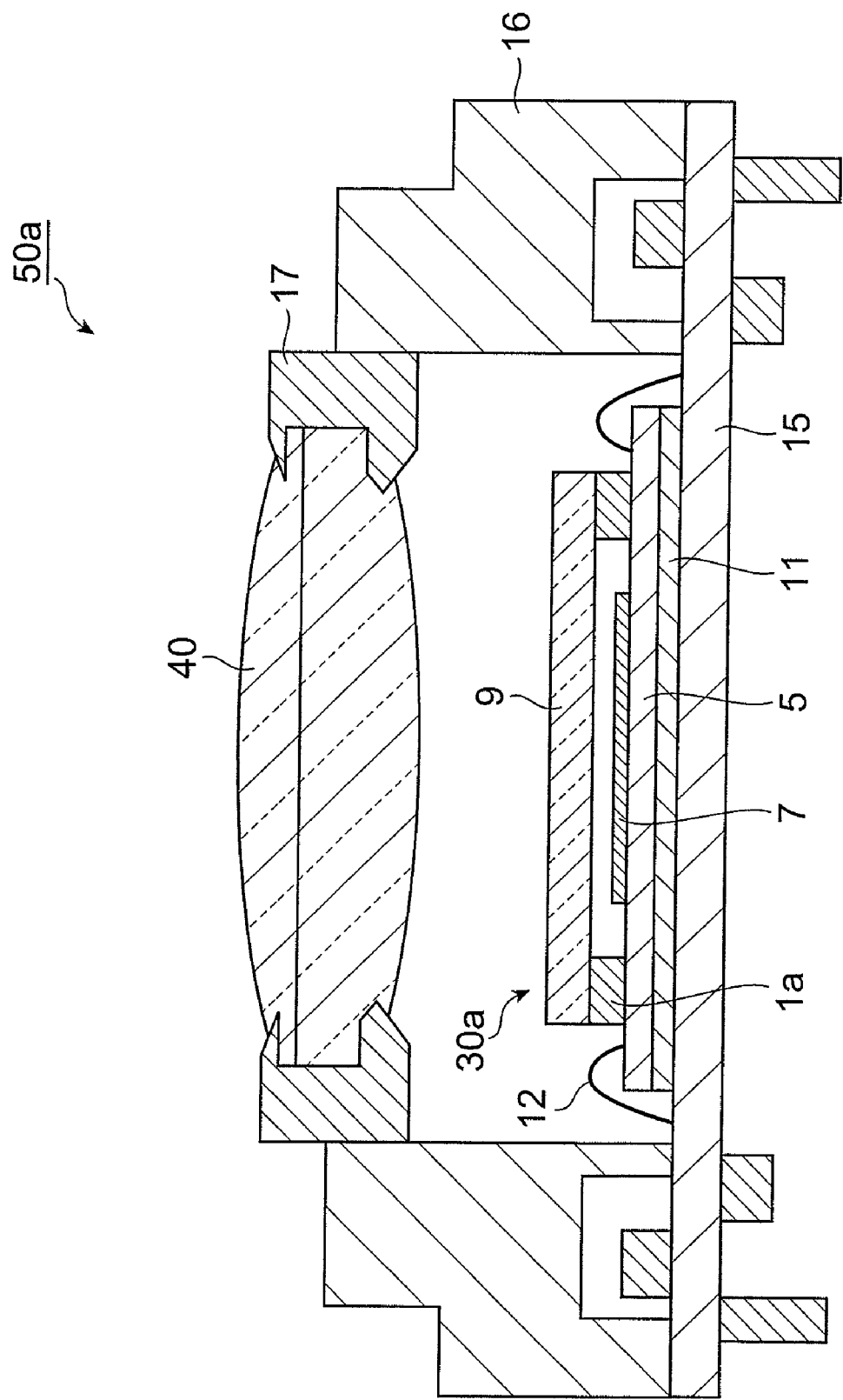
FIG. 15 is a cross-sectional view showing an embodiment of a CCD camera module according to the electronic component of the invention.

FIG. 15 is a cross-sectional view showing an embodiment of a CCD camera module according to the electronic component of the invention. A CCD camera module 50a shown in FIG. 15 is an electronic component comprising the semiconductor device 30a as a solid-state image sensing device. The semiconductor device 30a is bonded to a supporting substrate 15 for semiconductor device mounting via a die bonding film 11. The semiconductor device 30a is electrically connected to an external connection terminal via a wire 12.

A CCD camera module 50 comprises a lens 40 situated immediately above the effective pixel region 7, side walls 16 which enclose the lens 40 together with the semiconductor device 30a, and insertion members 17 interposed between the lens 40 and side walls 16 with the lens 40 inserted on the supporting substrate 15 for semiconductor device mounting.

Figure 16:
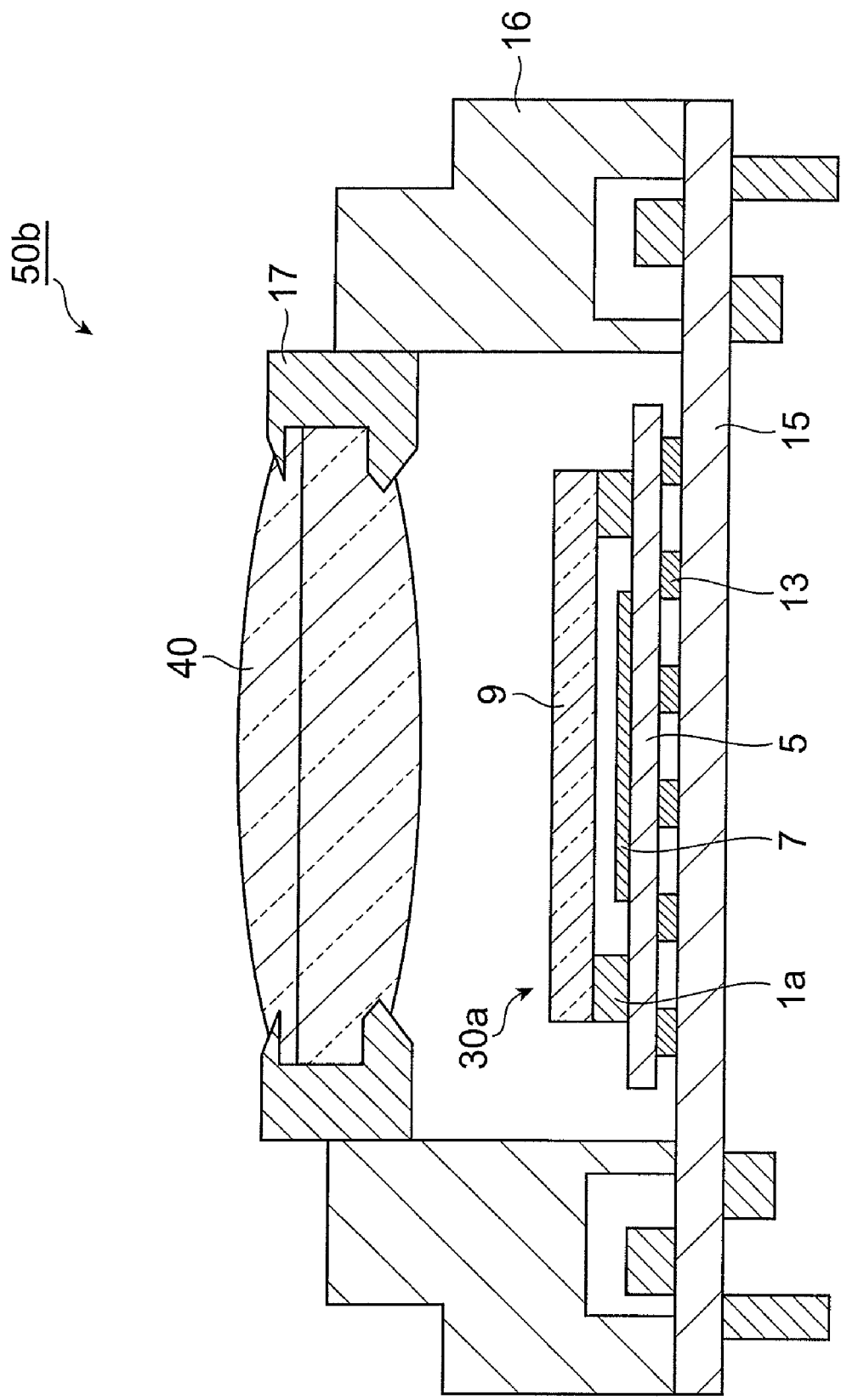
FIG. 16 is a cross-sectional view showing an embodiment of a CCD camera module according to the electronic component of the invention.

FIG. 16 is a cross-sectional view showing an embodiment of a CCD camera module according to the electronic component of the invention. A CCD camera module 50b shown in FIG. 16, instead of the construction of the aforesaid embodiment where the semiconductor device is bonded using a die bonding film, has a construction wherein the semiconductor device 30a is bonded to the supporting substrate 15 for semiconductor device mounting via solder 13.

EXAMPLES

Hereafter, the invention will be described in more detail referring to specific examples, but it should be understood that the invention is not to be construed as being limited to the following examples.

Synthesis of polyimide PI-1

7.6 g of 3,5-diaminobenzoic acid (hereafter, "DABA") and NMP were introduced in a flask provided with a stirrer, thermometer and nitrogen replacement device. Next, a solution of 15.5 g of 4,4'-oxydiphthalic acid dianhydride (hereafter, "ODPA") in NMP was dripped in the aforesaid flask while adjusting the temperature of the reaction system so that it did not exceed 50° C. After dripping was complete, the mixture was stirred at room temperature for 5 hours. Next, a reflux condenser with water receiver was attached to this flask, xylene was added, the temperature was raised to 180 degrees and this temperature was maintained for 5 hours. A brown solution was thus obtained. The obtained solution was cooled to room temperature, introduced into distilled water and reprecipitated. The obtained sediment was dried with a vacuum dryer, and a polyimide (hereafter "polyimide PI-1") was thus obtained.

When the GPC was measured with DMF as the mobile phase, the weight average molecular weight (polystyrene conversion) of polyimide PI-1 was 72000. The acid value computed from the blending ratio of the starting materials for polyimide PI-1 was 130 mg/KOH.

The acid value of the polyimide may be computed as follows based on the blending ratio of starting materials. For the tetracarboxylic acid dianhydride used as starting material, let the molecular weight be $Aw_n$ ($Aw_1$, $Aw_2$, $Aw_3$, . . . for each compound used), and let the molar number be $Am_n$ ($Am_1$, $Am_2$, $Am_3$, . . . for each compound used). For the diamine used as starting material, let the molecular weight be $Bw_n$ ($Bw_1$, $Bw_2$, $Bw_3$, . . . for each compound used), and let the molar number be $Bm_n$ ($Bm_1$, $Bm_2$, $Bm_3$, . . . for each compound used). The molar number of total tetracarboxylic acid dianhydride is $A_{all}$ ($A_{all}=\Sigma Am_n$), and the molar number of total diamine is $B_{all}$ ($B_{all}=\Sigma Bm_n$). When DABA is used as a carboxyl-group-containing diamine, the acid value may be computed from the equation: Acid value (mg/KOH)=$1/[\Sigma\{(Aw_n+Bw_n-36)\times(Am_n/A_{all})\times(Bm_n/B_{all})\}]\times55.1\times1000$.

When 5,5'-methylene-bis(anthranilic acid) (MBAA) is used as a carboxyl-group-containing diamine, the acid value may be computed from the equation: Acid value (mg/KOH)=$1/[\Sigma\{(Aw_n+Bw_n-36)\times(Am_n/A_{all})\times(Bm_n/B_{all})\}]\times55.1\times1000\times2$.

When no carboxyl-group-containing diamine is used, the acid value is considered to be less than 80.

A polyimide film of thickness 40 μm was manufactured by coating a varnish comprising a mixture of polyimide PI-1 with a solvent on a PET film which had been surface-treated with a mold release silicone, and drying. For a test piece of size 35 mm×10 mm cut out from this film, measurements were made at a heating rate of 5° C./min using a "RSA-2" (product name) viscoelasticity meter, frequency 1 Hz and measurement temperature-50° C. to 300° C., and the temperature at which tan δ showed a local maximum was taken as Tg of the polyimide PI-1. If tan δ showed a local maximum at plural temperatures, the temperature at which it showed the largest local maximum was taken as Tg. The Tg of the polyimide PI-1 was 200° C.

Synthesis of polyimide PI-2

6.84 g of DABA, 9.99 g of aliphatic ether diamine ("ED2000" (product name), BASF, molecular weight 1998) and NMP were introduced in a flask provided with a stirrer, thermometer and nitrogen replacement device. Next, a solution containing 16 g of ODPA dissolved in NMP was dripped in the flask while adjusting the temperature of the reaction system so that it did not exceed 50° C. All the remaining operations were identical to those for the synthesis of PI-1, and a polyimide (hereafter "polyimide PI-2") was thus obtained.

The weight average molecular weight of polyimide PI-2 and Tg were measured under identical conditions to those for polyimide PI-1. The weight average molecular weight was 51000, and Tg was 140° C. The acid value computed from the blending ratio of starting materials for polyimide PI-2 was 90 mg/KOH.

Synthesis of polyimide PI-3

2.28 g of DABA, 15.16 g of aliphatic ether diamine ("ED400" (product name), BASF, molecular weight 433) and NMP were introduced in a flask provided with a stirrer, thermometer and nitrogen replacement device. Next, a solution containing 16 g of ODPA dissolved in NMP was dripped in the flask while adjusting the temperature of the reaction system so that it did not exceed 50° C. All the remaining operations were identical to those for the synthesis of PI-1, and a polyimide (hereafter "polyimide PI-3") was thus obtained.

The weight average molecular weight and Tg of polyimide PI-3 were measured under identical conditions to those for polyimide PI-1. The weight average molecular weight was 47000, and Tg was 50° C. The acid value computed from the blending ratio of starting materials for polyimide PI-3 was 88 mg/KOH.

Synthesis of polyimide PI-4

1.9 g of DABA, 15.16 g of aliphatic ether diamine ("ED400" (product name), BASF, molecular weight 433), 0.87 g of 1,1,3,3-tetramethyl-1,3-bis(4-aminophenyl)disiloxane ("LP-7100" (product name), Shin-Etsu Chemical Co., molecular weight 348.4) and NMP were introduced in a flask provided with a stirrer, thermometer and nitrogen replacement device. Next, a solution containing 16 g of ODPA dissolved in NMP was dripped in the flask while adjusting the temperature of the reaction system so that it did not exceed 50° C. All the remaining operations were identical to those for the synthesis of PI-1, and a polyimide (hereafter "polyimide PI-4") was thus obtained.

The weight average molecular weight and Tg of polyimide PI-4 were measured under identical conditions to those for polyimide PI-1. The weight average molecular weight was 33000, and Tg was 55° C. The acid value computed from the blending ratio of starting materials for polyimide PI-4 was 88 mg/KOH.

Synthesis of polyimide PI-5

5.4 g of m-phenyldiamine and NMP were introduced in a flask provided with a stirrer, thermometer and nitrogen replacement device. Next, a solution containing 15.5 g of ODPA dissolved in NMP was dripped in the flask while adjusting the temperature of the reaction system so that it did not exceed 50° C. All the remaining operations were identical to those for the synthesis of PI-1, and a polyimide (hereafter "polyimide PI-5") was thus obtained.

The weight average molecular weight of polyimide PI-5 and Tg were measured under identical conditions to those for polyimide PI-1. The weight average molecular weight was 68000, and Tg was 210° C. The polyimide PI-5 was not synthesized using a diamine containing a carboxylic acid, so its acid value was considered to be less than 80 mg/KOH.

Synthesis of polyimide PI-6

99.9 g of aliphatic ether diamine ("ED2000" (product name), BASF, molecular weight 1998) and NMP were introduced in a flask provided with a stirrer, thermometer and nitrogen replacement device. Next, a solution containing 15.5 g of ODPA dissolved in NMP was dripped in the flask while adjusting the temperature of the reaction system so that it did not exceed 50° C. All the remaining operations were identical to those for the synthesis of PI-1, and a polyimide (hereafter "polyimide PI-6") was thus obtained.

The weight average molecular weight and Tg of polyimide PI-6 were measured under identical conditions to those for polyimide PI-1. The weight average molecular weight was 74000, and Tg was 10° C. The polyimide PI-6 was not synthesized using a diamine containing a carboxylic acid, so its acid value was considered to be less than 80 mg/KOH.

Synthesis of polyimide PI-7

49.95 g of aliphatic ether diamine ("ED2000" (product name), BASF, molecular weight 1998), 8.71 g of 1,1,3,3-tetramethyl-1,3-bis(4-aminophenyl)disiloxane ("LP-7100" (product name), Shin-Etsu Chemical Co., molecular weight 348.4) and NMP were introduced in a flask provided with a stirrer, thermometer and nitrogen replacement device. Next, a solution containing 16 g of ODPA dissolved in NMP was dripped in the flask while adjusting the temperature of the reaction system so that it did not exceed 50° C. All the remaining operations were identical to those for the synthesis of PI-1, and a polyimide (hereafter "polyimide PI-7") was thus obtained.

The weight average molecular weight and Tg of polyimide PI-7 were measured under identical conditions to those for polyimide PI-1. The weight average molecular weight was 45000, and Tg was 30° C. The polyimide PI-7 was not synthesized using a diamine containing a carboxylic acid, so its acid value was considered to be less than 80 mg/KOH.

Synthesis of polyimide PI-8

2.15 g of 5,5'-methylene-bis(anthranilic acid) (hereafter, "MBAA", molecular weight 286.28), 15.59 g of aliphatic ether diamine ("ED400" (product name), BASF, molecular weight 433), 2.26 g of 1,1,3,3-tetramethyl-1,3-bis(4-aminophenyl)disiloxane ("LP-7100" (product name), Shin-Etsu Chemical Co., molecular weight 348.4) and NMP were introduced in a flask provided with a stirrer, thermometer and nitrogen replacement device. Next, a solution containing 17 g of ODPA dissolved in NMP was dripped in the flask while adjusting the temperature of the reaction system so that it did not exceed 50° C. All the remaining operations were identical to those for the synthesis of PI-1, and a polyimide (hereafter "polyimide PI-8") was thus obtained.

The weight average molecular weight and Tg of polyimide PI-8 were measured under identical conditions to those for polyimide PI-1. The weight average molecular weight was 28000, and Tg was 30° C. The acid value computed from the blending ratio of starting materials for polyimide PI-8 was 167 mg/KOH.

Synthesis of polyimide PI-9

2.10 g of 1,12-diamine dodecane (hereafter, "DDO"), 17.98 g of aliphatic ether diamine ("ED2000" (product name), BASF, molecular weight 1998), 2.61 g of 1,1,3,3-tetramethyl-1,3-bis(4-aminophenyl)disiloxane ("LP-7100" (product name), Shin-Etsu Chemical Co., molecular weight 348.4) and NMP were introduced in a flask provided with a stirrer, thermometer and nitrogen replacement device. Next, a solution containing 15.62 g of 4,4'-(4,4'-isopropylidene diphenoxy)bis(phthalic acid dianhydride) (hereafter, "BPADA") dissolved in NMP was dripped in the flask while adjusting the temperature of the reaction system so that it did not exceed 50° C. All the remaining operations were identical to those for the synthesis of PI-1, and a polyimide (hereafter "polyimide PI-9") was thus obtained.

The weight average molecular weight and Tg of polyimide PI-9 were measured under identical conditions to those for polyimide PI-1. The weight average molecular weight was 70000, and Tg was 53° C. The polyimide PI-9 was not synthesized using a diamine containing a carboxylic acid, so its acid value was considered to be less than 80 mg/KOH.

Synthesis of polyimide PI-10

6.83 g of 2,2-bis(4-aminophenoxyphenyl)propane (hereafter, "BAPP"), 3.40 g of 4.9-dioxadecane-1,12-diamine (hereafter, "B-12") and NMP were introduced in a flask provided with a stirrer, thermometer and nitrogen replacement device. Next, a solution containing 17.40 g of decamethylene bistrimellitate dianhydride (hereafter, "DBTA") dissolved in NMP was dripped in the flask while adjusting the temperature of the reaction system so that it did not exceed 50° C. All the remaining operations were identical to those for the synthesis of PI-1, and a polyimide (hereafter "polyimide PI-10") was thus obtained.

The weight average molecular weight and Tg of polyimide PI-10 were measured under identical conditions to those for polyimide PI-1. The weight average molecular weight was 89000, and Tg was 73° C. The polyimide PI-10 was not synthesized using a diamine containing a carboxylic acid, so its acid value was considered to be less than 80 mg/KOH.

Synthesis of polyimide PI-11

14.3 g of MBAA and NMP were introduced in a flask provided with a stirrer, thermometer and nitrogen replacement device. Next, a solution containing 16 g of ODPA dissolved in NMP was dripped in the flask while adjusting the temperature of the reaction system so that it did not exceed 50° C. All the remaining operations were identical to those for the synthesis of PI-1, and a polyimide (hereafter "polyimide PI-11") was thus obtained.

The weight average molecular weight of polyimide PI-11 and Tg were measured under identical conditions to those for polyimide PI-1. The weight average molecular weight was 82000, and Tg was 180° C. The acid value computed from the blending ratio of starting materials for polyimide PI-11 was 197 mg/KOH.

TABLE 1 and TABLE 2 show the blending ratios (molar ratios) for polyimide synthesis, and the test results for the obtained polyimides. The values of the blending ratios in Table 1 are values (mole %) when total tetracarboxylic acid dianhydride and total diamine are taken as references, respectively.

TABLE 1

|  |  | PI-1 | PI-2 | PI-3 | PI-4 | PI-5 | PI-6 | PI-7 |
|---|---|---|---|---|---|---|---|---|
| Tetracarboxylic acid dianhydride | ODPA | 100 | 100 | 100 | 100 | 100 | 100 | 100 |
| Aromatic diamine of formula (I) | DABA | 100 | 90 | 30 | 25 | — | — | — |

TABLE 1-continued

|  |  | PI-1 | PI-2 | PI-3 | PI-4 | PI-5 | PI-6 | PI-7 |
|---|---|---|---|---|---|---|---|---|
| Aliphatic ether diamine of formula (III) | ED2000 | — | 10 | — | — | — | 100 | 50 |
|  | ED400 | — | — | 70 | 70 | — | — | — |
| Siloxane diamine of formula (IV) | LP7100 | — | — | — | 5 | — | — | 50 |
| m-phenylenediamine |  | — | — | — | — | 100 | — | — |
| Weight average molecular weight |  | 72000 | 51000 | 47000 | 33000 | 68000 | 74000 | 45000 |
| Acid value (mg/KOH) |  | 130 | 90 | 88 | 88 | <80 | <80 | <80 |
| Tg (° C.) |  | 200 | 140 | 50 | 55 | 210 | 10 | 30 |

TABLE 2

|  |  | PI-8 | PI-9 | PI-10 | PI-11 |
|---|---|---|---|---|---|
| Tetracarboxylic acid dianhydride | ODPA | 100 | — | — | 100 |
|  | BPADA | — | 100 | — | — |
|  | DBTA | — | — | 100 | — |
| Aromatic diamine of formula (II) | MBAA | 15 | — | — | 100 |
| Aliphatic ether diamine of formula (III) | ED400 | 72 | 30 | — | — |
| Siloxane diamine of formula (IV) | LP7100 | 13 | 35 | — | — |
| DDO |  | — | 35 | — | — |
| BAPP |  | — | — | 50 | — |
| B-12 |  | — | — | 50 | — |
| Weight average molecular weight |  | 28000 | 70000 | 89000 | 82000 |
| Acid value (mg/KOH) |  | 167 | <80 | <80 | 197 |
| Tg (° C.) |  | 30 | 53 | 73 | 180 |

Example 1

Polyimide PI-1, ethoxylated bisphenol A dimethacrylate ("BPE-100" (product name) by Shin Nakamura Chemicals Co.) as photo-polymerizable compound and bis(2,4,6-trimethylbenzoyl)-phenyl phosphine oxide ("1-819" (product name), Chiba Specialty Chemicals Co.) as photopolymerization initiator were blended uniformly in cyclohexanone to manufacture an adhesive film-forming varnish so that the composition (weight parts) shown in Table 3 was obtained. This varnish was applied on to a PET film which had been surface-treated with mold release silicone, dried, and an adhesive film of thickness 40 μm was thereby formed.

Examples 2 to 7, Comparative Examples 1 to 8

An adhesive film was produced in an identical way to that of Example 1, except that the starting materials and compositions shown in TABLE 3 or 4, respectively, were used.

The details of the starting materials shown in Tables 3, 4 are as follows.

BPE-100: Shin Nakamura Chemicals, ethoxylated bisphenol A dimethacrylate

U-2PPA: Shin Nakamura Chemical Co., urethane acrylate

YDF-8170: Toto Chemical Co., bisphenol F epoxy resin

ESCN-195: Sumitomo Chemical Co., cresol novolak solid epoxy resin

H-1: Meiwa Chemical Co., phenol novolak

R972: Nippon Aerogel Co., hydrophobic fumed silica (mean particle diameter: approx. 16 nm)

TABLE 3

|  |  | Examples |  |  |  |  |  |  |
|---|---|---|---|---|---|---|---|---|
|  |  | 1 | 2 | 3 | 4 | 5 | 6 | 7 |
| Polyimide (acid value) | PI-2(90) | 100 | 100 | — | — | — | — | — |
|  | PI-3(100) | — | — | 100 | — | — | — | — |
|  | PI-4(88) | — | — | — | 100 | 100 | 100 | — |
|  | PI-8(167) | — | — | — | — | — | — | 100 |
| Photo-polymerizable compound | BPE-100 | 20 | 20 | 20 | 20 | 15 | 40 | 35 |
|  | U-2PPA | — | — | — | — | 15 | 40 | 35 |
| Photopolymerization initiator | I-819 | 3 | 3 | 3 | 3 | 3 | 3 | 3 |
| Epoxy resin | YDF-8170 | — | 15 | 15 | 15 | 15 | 15 | 15 |
|  | ESCN-195 | — | — | — | — | — | 5 | 5 |
| Curing agent | H-1 | — | — | — | — | 5 | 5 | 5 |
| Filler | R972 | — | — | — | — | 5 | 5 | 5 |
| Film properties |  |  |  |  |  |  |  |  |
| Pattern-forming properties |  | A | A | A | A | A | A | A |
| Sticking properties at low temperatures |  | A | A | A | A | A | A | A |
| Shear adhesive strength (MPa) | 25° C. | 13 | 17 | 15 | 20 | 30 | 30 | 20 |
|  | 260° C. | <0.1 | 0.5 | 0.4 | 0.5 | 0.6 | 0.9 | 0.5 |
| Elastic modulus at 100° C. after light exposure (MPa) |  | 0.05 | 0.07 | 0.1 | 1 | 2 | 5 | 4 |
| Elastic modulus at 260° C. after heat curing (MPa) |  | Measurement not possible. | 5 | 5 | 5 | 11 | 13 | 13 |
| 5% weight decrease temperature (° C.) |  | 330 | 286 | 292 | 290 | 294 | 297 | 296 |
| Water absorption rate (%) |  | 1.9 | 1.9 | 1.8 | 1.8 | 1.7 | 1.5 | 2.3 |

TABLE 4

| | | Comparative Examples | | | | | | | |
|---|---|---|---|---|---|---|---|---|---|
| | | 1 | 2 | 3 | 4 | 5 | 6 | 7 | 8 |
| Polyimide (acid value) | PI-1(130) | 100 | — | — | — | — | — | — | — |
| | PI-2(90) | — | 100 | — | — | — | — | — | — |
| | PI-5(<80) | — | — | 100 | — | — | — | — | — |
| | PI-6(<80) | — | — | — | 100 | — | — | — | — |
| | PI-7(<80) | — | — | — | — | 100 | — | — | — |
| | PI-9(<80) | — | — | — | — | — | 100 | — | — |
| | PI-10(<80) | — | — | — | — | — | — | 100 | — |
| | PI-11(197) | — | — | — | — | — | — | — | 100 |
| Photo-polymerizable compound | BPE-100 | — | — | — | 20 | 20 | — | — | 20 |
| | U-2PPA | — | — | — | — | — | — | — | — |
| Photopolymerization initiator | I-819 | — | — | — | 3 | 3 | — | — | 3 |
| Epoxy resin | YDF-8170 | — | — | — | 15 | 15 | — | — | 15 |
| | ESCN-195 | — | — | — | — | — | 25 | 25 | — |
| Curing agent | H-1 | — | — | — | — | — | 13 | 13 | 5 |
| Film properties | | | | | | | | | |
| Pattern-forming properties | | C | C | C | C | C | C | C | C |
| Sticking properties at low temperatures | | C | C | C | A | A | A | C | C |
| Shear adhesive strength (MPa) | 25° C. | — | 12 | — | 10 | 20 | 30 | 30 | 30 |
| | 260° C. | — | <0.1 | — | 0.3 | 0.4 | 8 | 10 | <0.1 |
| Elastic modulus at 100° C. after light exposure (MPa) | | 2000 | <0.01 | 2500 | 0.03 | 0.03 | 0.2 | 4.3 | 1800 |
| Elastic modulus at 260° C. after heat curing (MPa) | | 2 | Measurement not possible. | 10 | 3 | 6 | 1.7 | 2.3 | 10 |
| 5% weight decrease temperature (° C.) | | 320 | 180 | 100 | 280 | 285 | 380 | 430 | 297 |
| Water absorption rate (%) | | 3.0 | 2.3 | 1.0 | 1.9 | 1.7 | 0.6 | 0.3 | 3.5 |

For the obtained adhesive films, pattern-forming properties, sticking properties at low temperatures and shear adhesive strength were evaluated by the methods shown below. The evaluation results are collectively shown in TABLES 3, 4.

(1) Pattern-Forming Properties

An adhesive film was laminated by pressurizing it with a roller onto a silicon wafer (diameter 6 inches, thickness 400 μm), and a mask was laid thereupon. After light exposure with a high precision parallel device (ORC Manufacturing Co.), spray developing was performed using a 2.38% solution of tetramethyl ammonium hydride (TMAH). After developing, an examination was performed to verify whether a pattern (line width 1 mm) had been formed. If a pattern had been formed, the result was designated as A, and if a pattern had not been formed, the result was designated as C.

(2) Sticking Properties at Low Temperatures

An adhesive film was laminated on a back side (opposite to a supporting platform) of silicon wafer on a supporting platform (diameter 6 inch, thickness 400 μm) by pressurizing with a roller (temperature 100° C., linear pressure 4 kgf/cm, feed rate 0.5 m/min). The PET film was peeled off, and a "Upirex" (product name) polyimide film of thickness 80 μm, width 10 mm and length 40 mm was laminated by pressurizing with a roller under identical conditions to the above. For the sample thus obtained, a 90° peel test was performed at room temperature using a "Strograph E-S" (product name) rheometer, and the peel strength between the adhesive film and Upirex was measured. Samples having a peel strength of 2N/cm or more were designated A, and samples having less than 2N/cm were designated C.

(3) Adhesiveness (Shear Adhesive Strength)

An adhesive film was laminated on a silicon wafer (diameter 6 inch, thickness 400 μm) under the conditions of 80° C., linear pressure: 4 kgf/cm, feed rate: 0.5 m/min using a device having a roll and a support. Next, the laminate was irradiated by ultraviolet light under the condition of light exposure: 1000 mJ/cm² from the PET film side using a high precision parallel exposure device (ORC Manufacturing Co.). The PET film was peeled away, and a pressure-sensitive dicing tape was laminated on the adhesive film. The silicon wafer was cut out together with the adhesive film to a size of 3 mm×3 mm using a dicer, and a silicon chip on which the adhesive film was laminated, was thus obtained. This silicon chip was mounted on a glass substrate of 10 mm×10 mm×0.55 mm thickness with the adhesive film sandwiched therebetween, and bonded by thermocompression on a 120° C. heating plate under 500 gf for 10 seconds. Next, it was heated in a 160° C. oven for 3 hours to heat-cure the adhesive film. The maximum stress for the sample, when an external force in the shear direction was applied to the lateral wall of the silicon chip on a hot plate heated at 25° C. or 260° C. under the conditions of measurement rate: 50 μm/sec and measurement height: 50 μm, using a "Dage-4000" adhesion tester, Dage Co., was taken to be the shear adhesive strength at 25° C. or 260° C.

(4) Elastic Modulus at 100° C. after Light Exposure

An adhesive film was cut to a size of 35 mm×10 mm and irradiated by ultraviolet light from the PET film side under the condition of light exposure: 1000 mJ/cm² using a high precision parallel exposure device (ORC Manufacturing Co.). Dynamic viscoelasticity was measured using a "RSA-2" viscoelasticity analyzer, Rheometrix Co., under the conditions of heating rate: 5° C./min, frequency: 1 Hz, measurement temperature: −50° C. to 200° C. using an adhesive film after light exposure from which the PET film had been peeled off as test piece. The storage modulus at 100° C. was obtained from this dynamic viscoelasticity measurement.

(5) Elastic Modulus at 260° C. after Heat-Curing

An adhesive film was cut to a size of 35 mm×10 mm, and irradiated by ultraviolet light from the PET film side under the condition of light exposure: 1000 mJ/cm² using a high precision parallel exposure device (ORC Manufacturing Co.). After peeling off the PET film, the adhesive film was cured by heating in a 160° C. oven for 3 hours. Dynamic viscoelasticity was measured using a "RSA-2" viscoelasticity analyzer, Rheometrix Co., under the conditions of heating rate: 5° C./min, frequency: 1 Hz, measurement temperature: −50° C. to 300° C. using the cured adhesive film as test piece. The storage modulus at 260° C. was obtained from this dynamic viscoelasticity measurement.

(6) 5% Mass Decrease Temperature

An adhesive film was irradiated by ultraviolet light from the PET film side under the condition of light exposure: 1000 mJ/cm² using a high precision parallel exposure device (ORC Manufacturing Co.). After the PET film was peeled off, the adhesive film was cured by heating in a 160° C. oven for 3 hours. A thermogravimetric analysis was performed on the powder obtained by finely crushing the cured adhesive film under the conditions of heating rate: 10° C./min, air flow rate: 80 mL/min, measurement temperature: 40° C. to 400° C., using an "EXSTAR 6300" Simultaneous Thermogravimetric Differential Thermal Analyzer, S.I.I. Nanotechnology Co. From this thermogravimetric analysis, the temperature at which the mass percentage reduction relative to the initial mass is 5% (5% mass decrease temperature), was evaluated.

As shown in TABLE 3, it is seen that the adhesive films of the examples had superior pattern-forming properties and low temperature sticking properties. Also, the adhesive films of the examples showed high adhesive strength by compression after light exposure, and were also superior in respect of re-adhesiveness after light exposure. On the other hand, as shown in TABLE 4, the adhesive films of the comparative examples were not adequate in respect of pattern-forming properties, low temperature sticking properties or re-adhesiveness.

The photosensitive adhesive composition of the invention has a large dissolution rate in alkali developer solution, superior pattern-forming properties using an alkali developer solution, and high re-adhesiveness after light exposure. Further, the adhesive film of the invention can be stuck to an adherend at relatively low temperature, and since thermal damage to surrounding material is thereby suppressed, a reliable semiconductor device and electronic component are obtained.

What is claimed is:

1. A semiconductor device comprising a semiconductor chip bonded to an adherend using a photosensitive adhesive comprising:
   (A) a polymer soluble in an alkaline aqueous solution;
   (B) a photo-qolymerizable compound; and
   (C) a photopolymerization initiator.

2. A semiconductor device according to claim 1, the photosensitive adhesive further comprising (D) a thermosetting resin.

3. A semiconductor device according to claim 1, wherein said polymer soluble in an alkaline aqueous solution is a polyimide having a carboxyl group as a side chain.

4. A semiconductor device according to claim 3, wherein said polyimide is a polyimide obtainable by reacting at least one tetracarboxylic acid dianhydride and at least one diamine, said at least one diamine including an aromatic diamine expressed by the following general formulae (I) or (II):

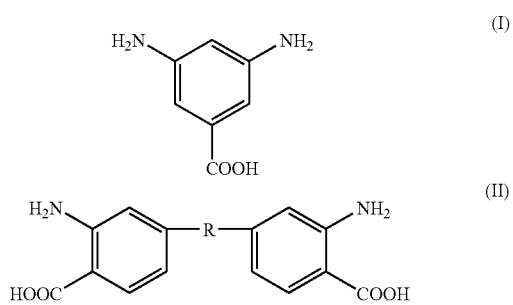

wherein R is a divalent organic group.

5. A semiconductor device according to claim 1, wherein the weight average molecular weight of said polymer soluble in an alkaline aqueous solution is 5000 to 150000.

6. A semiconductor device according to claim 1, wherein the glass transition temperature of said polymer soluble in an alkaline aqueous solution is 150° C. or less.

7. An electronic component comprising a semiconductor device according to claim 1.

8. A semiconductor device according to claim 1, the photosensitive adhesive further comprising a coupling agent.

9. A semiconductor device according to claim 8, wherein said coupling agent is selected from the group consisting of a silane coupling agent and a titanium coupling agent.

10. A semiconductor device according to claim 1, wherein said adherend is a glass substrate.

11. A semiconductor device according to claim 10, wherein said photosensitive adhesive provides a shear adhesive strength at 25° C. of at least 5 MPa.

12. A semiconductor device according to claim 11, wherein said photosensitive adhesive provides a shear adhesive strength at 260° C. of at least 0.5 MPa.

13. A semiconductor device according to claim 1, wherein the photosensitive adhesive, after light exposure, has a storage modulus, at 100° C., of 0.01 to 10 MPa.

14. A method for producing a semiconductor device, comprising the steps of:
   forming an adhesive pattern by forming an adhesive layer consisting of a photosensitive adhesive on an adherend, light-exposing the adhesive layer; and developing the adhesive layer after exposure; and
   bonding another adherend to the adherend via the adhesive pattern,
   wherein the adhesive layer consists of a photosensitive adhesive comprising:
   (A) a polymer soluble in an alkaline aqueous solution;
   (B) a photo-polymerizable compound; and
   (C) a photopolymerization initiator.

15. The method for producing a semiconductor device according to claim 14, the photosensitive adhesive further comprising (D) a thermosetting resin.

16. The method for producing a semiconductor device according to claim 14, wherein said polymer soluble in an alkaline aqueous solution is a polyimide having a carboxyl group as a side chain.

17. The method for producing a semiconductor device according to claim 16, wherein said polyimide is a polyimide obtainable by reacting at least one tetracarboxylic acid dianhydride and at least one diamine, said at least one diamine including an aromatic diamine expressed by the following general formulae (I) or (II):

(I) 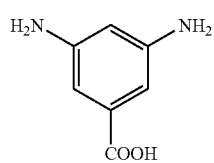

(II) 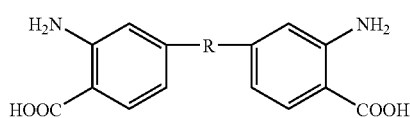

wherein R is a divalent organic group.

18. The method for producing a semiconductor device according to claim 14, wherein the weight average molecular weight of said polymer soluble in an alkaline aqueous solution is 5000 to 150000.

19. The method for producing a semiconductor device according to claim 14, wherein the glass transition temperature of said polymer soluble in an alkaline aqueous solution is 150° C. or less.

20. The method for producing a semiconductor device according to claim 14, wherein the photosensitive adhesive, after light exposure, has a storage modulus, at 100° C., of 0.01 to 10 MPa.

* * * * *